US007816918B2

(12) United States Patent
Bottomley et al.

(10) Patent No.: US 7,816,918 B2
(45) Date of Patent: Oct. 19, 2010

(54) OPTIMIZED MRI STRIP ARRAY DETECTORS AND APPARATUS, SYSTEMS AND METHODS RELATED THERETO

(75) Inventors: Paul A. Bottomley, Columbia, MD (US); Ananda Kumar, Baltimore, MD (US)

(73) Assignee: The Johns Hopkins University, Baltimore, MD (US)

( * ) Notice: Subject to any disclaimer, the term of this patent is extended or adjusted under 35 U.S.C. 154(b) by 538 days.

(21) Appl. No.: 11/807,108

(22) Filed: May 24, 2007

(65) Prior Publication Data

US 2009/0015256 A1 Jan. 15, 2009

(51) Int. Cl.
*G01V 3/00* (2006.01)

(52) U.S. Cl. ...................................... 324/318; 324/322

(58) Field of Classification Search ................ 324/318, 324/322
See application file for complete search history.

(56) References Cited

U.S. PATENT DOCUMENTS 3,789,832 A 2/1974 Damadian
4,638,253 A 1/1987 Jaskolski et al.
4,689,563 A 8/1987 Bottomley et al.
4,751,464 A 6/1988 Bridges
4,783,641 A 11/1988 Hayes et al.
4,825,162 A 4/1989 Roemer et al.
4,968,937 A 11/1990 Akgun et al.
5,017,872 A 5/1991 Foo et al.
5,086,275 A 2/1992 Roemer
5,212,450 A 5/1993 Murphy-Boesch et al.
5,270,656 A 12/1993 Roberts et al.
5,363,845 A 11/1994 Chowdhury et al.
5,365,172 A 11/1994 Hrovat et al.
5,367,261 A 11/1994 Frederick (Continued)

FOREIGN PATENT DOCUMENTS

WO WO-2006/090293 A2 8/2006

OTHER PUBLICATIONS

Wright, et al., "Arrays of Mutually Coupled Receiver Coils: Theory and Application", Magnetic Resonance in Medicine 17, 252-268 (1991).

(Continued)

*Primary Examiner*—Louis M Arana
(74) *Attorney, Agent, or Firm*—Edwards Angell Palmer & Dodge LLP; Peter F. Cortes; William J. Daley, Jr.

(57) ABSTRACT

Featured is a device for NMR or MRI signals from excited nuclei as well as related apparatus, systems and methods. The device includes a strip array antenna including one or more conductor and N reactive tuning components, where N is an integer ≧1 at least one of the N reactive components is electrically coupled to each of the one or more conductors as well as to ground/virtual ground. The apparent electrical length of the conductors is tuned with the reactive tuning components so it is equal to be about nλ/4, where n is an integer ≧1 and λ is the wavelength of the signal to be detected. The length of the strip also is such as to be substantially in the approximate range of 1.3 times the depth of interest. The strip conductors are also combined with loop coils to form quadrature detectors.

24 Claims, 19 Drawing Sheets y
100
W
112
x
g
140
h
150
110

U.S. PATENT DOCUMENTS 5,467,017 A 11/1995 Duerr et al.
5,499,629 A 3/1996 Kerr et al.
5,523,689 A 6/1996 Oppelt et al.
5,621,322 A 4/1997 Ehnholm et al.
5,642,048 A 6/1997 Crozier et al.
5,744,957 A 4/1998 Vaughan, Jr.
5,898,306 A 4/1999 Liu et al.
5,910,728 A 6/1999 Sodickson
5,990,681 A 11/1999 Richard et al.
5,998,999 A 12/1999 Richard et al.
6,028,428 A 2/2000 Cunningham et al.
6,169,401 B1 1/2001 Fujita et al.
6,236,206 B1 5/2001 Hartman et al.
6,252,403 B1 6/2001 Alsop
6,285,189 B1 9/2001 Wong
6,289,232 B1 9/2001 Jakob et al.
6,316,941 B1 11/2001 Fujita et al.
6,396,271 B1 5/2002 Burl et al.
6,420,871 B1 7/2002 Wong et al.
6,476,606 B2 11/2002 Lee
6,727,703 B2 4/2004 Lee
6,771,070 B2 8/2004 Lee
6,982,554 B2 1/2006 Kurpad et al.
7,023,209 B2 * 4/2006 Zhang et al. ................ 324/318
7,088,104 B2 8/2006 Bottomley
2005/0062472 A1 * 3/2005 Bottomley .................. 324/317

OTHER PUBLICATIONS

Roemer, et al., “The NMR Phased Array”, Magnetic Resonance in Medicine 16, 192-225 (1990).

Vaughan, et al., “High Frequency Volume Coils for Clinical NMR Imaging and Spectroscopy”, Magnetic Resonance in Medicine 32:206-218 (1994).

Lee et al., “An Analytical SMASH Procedure (ASP) for Sensitivity-Encoded MRI”, Magnetic Resonance in Medicine, 43:716-725 (May 2000).

* cited by examiner

FIG. 10B

Comparison of numerically- and empirically-determined tuning capacitors.

| Detector | Experimental capacitor value (pF) | Numerical calculation capacitor value (pF) |
|---|---|---|
| L=10 cm; W/*h* =1; $\varepsilon_r$ =1 | 68 | 68.5 |
| L=15 cm; W/*h* =1; $\varepsilon_r$ =1 | 51 | 50 |
| L=15 cm; W/*h* =1; $\varepsilon_r$ =5 | 52 | 51 |
| L=20 cm; W/*h* =1; $\varepsilon_r$ =1 | 43 | 41 |
| L=20 cm; W/*h* =2; $\varepsilon_r$ =1 | 51 | 52 |
| L=20 cm; W/*h* =4; $\varepsilon_r$ =1 | 62 | 67 |
| L=30 cm; W/*h* =1; $\varepsilon_r$ =1 | 24 | 28 |

FIG. 11

Intrinsic SNR (ml Hz$^{1/2}$, upper figures, bold type) and raw pixel SNR (lower figures) for all experimental loop and strip detectors measured at the set of depths that correspond to the optimum theoretical (intrinsic) SNR for all of the strips and loops investigated in this study. The depth corresponding to the theoretical optimum for each detector is shaded. $Q_L$, and $Q_U$ are the loaded and unloaded coil Quality factors.

| Detector | Q factor | | Depth (mm) | | | | |
|---|---|---|---|---|---|---|---|
| | $Q_U$ | $Q_L$ | 77 | 85 | 115 | 155 | 230 |
| 3 inch GE loop | 179 | 44 | **5700** | **4652** | **2485** | **1130** | **336** |
| | | | 189 | 154 | 82 | 37 | 11 |
| 5.5 inch GE loop | 260 | 20 | **3337** | **2686** | **2084** | **875** | **77** |
| | | | 122 | 98 | 76 | 32 | 3 |
| L=10 cm; | 139 | 122 | **5701** | **4685** | **2285** | **1078** | **637** |
| W/*h*=1; *h* = 6 mm; $\varepsilon_r$ =1 | | | 76 | 63 | 30 | 14 | 8 |
| L=15cm; | 128 | 93 | **3443** | **2727** | **1344** | **623** | **320** |
| W/*h*=1; *h* = 6 mm; $\varepsilon_r$ =1 | | | 67 | 54 | 27 | 13 | 6 |
| L=15cm; | 75 | 61 | **2382** | **1843** | **965** | **561** | **314** |
| W/*h*=1; *h* = 6 mm; $\varepsilon_r$ =5 | | | 39 | 30 | 16 | 9 | 5 |
| L=20 cm; | 189 | 126 | **3774** | **2864** | **1568** | **981** | **442** |
| W/*h*=1; *h* = 6 mm; $\varepsilon_r$ =1 | | | 83 | 63 | 34 | 22 | 10 |
| L=20 cm; | 183 | 84 | **4685** | **3929** | **2274** | **994** | **410** |
| W/*h*=4; *h* = 6 mm; $\varepsilon_r$ =1 | | | 131 | 110 | 64 | 28 | 11 |
| L=30 cm; | 220 | 148 | **3211** | **2706** | **1509** | **734** | **416** |
| W/*h*=1; *h* = 6 mm; $\varepsilon_r$ =1 | | | 70 | 59 | 33 | 16 | 9 |

FIG. 12

| Rules of thumb for designing λ/4 strip detectors with optimum ISNR | |
|---|---|
| I. | Air dielectric ($\varepsilon_r = 1$) out-performs other dielectric substrates. |
| II. | The number of tuning capacitors $n \geq 2$ does not significantly affect ISNR. |
| III. | W is a weak determinant of ISNR. Increasing W, for constant $h$, generally increases ISNR. |
| IV. | ISNR decreases as $h$ increases ($h$ >5 mm), for constant W. ISNR loss is greater at shallow depths. A dielectric overlay improves ISNR performance. |
| V. | ISNR along the strip axis is nonuniform. The maximum is at $z \sim 0.7$L. |
| VI. | The optimum ISNR at depth $d$ results from a strip length L = 1.3 (±0.2)$d$. |
| VII. | The ISNR of an optimized strip detector is comparable to an optimized loop coil: higher close to the detector, lower at depth. The fields-of-view differ. |

FIG. 13

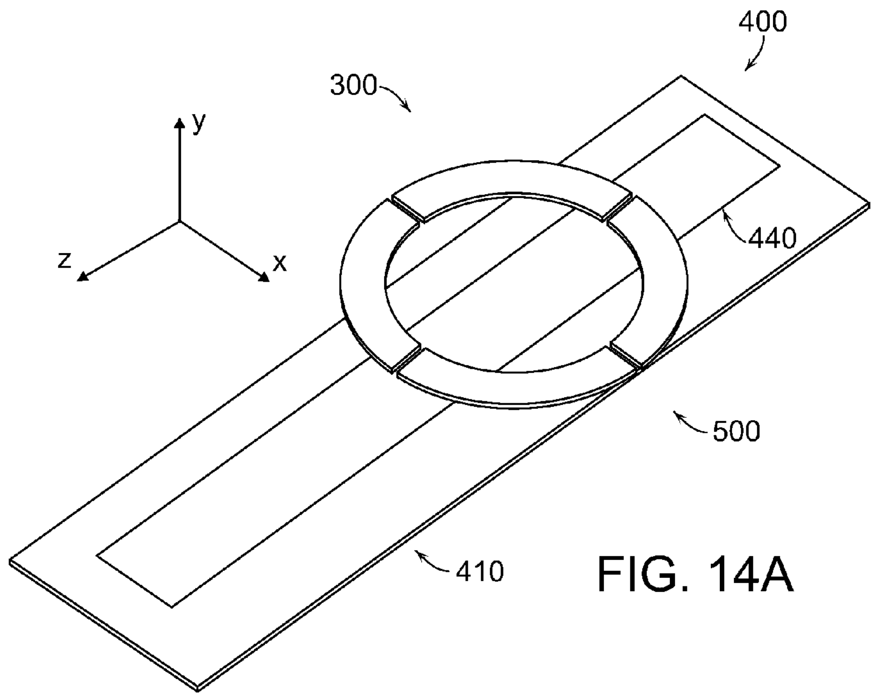

OPTIMIZED MRI STRIP ARRAY DETECTORS AND APPARATUS, SYSTEMS AND METHODS RELATED THERETO

STATEMENT REGARDING FEDERALLY-SPONSORED RESEARCH

The present invention was supported by grants from the National Institute of Health (NIH), grant number RR015396. The U.S. Government may have certain rights to the present invention.

FIELD OF INVENTION

The present invention generally relates to apparatus and methods for nuclear magnetic resonance (NMR), magnetic resonance (MR) imaging (MRI), and magnetic resonance spectroscopy (MRS). More particularly the present invention relates to a detector having a tunable near-field radio-frequency strip array antenna that can be used for conventional NMR, conventional spatially encoded MRI or MRS and parallel spatial encoded MRI. More particularly, the present invention relates to such a detector having tunable near-field radio-frequency strip array antenna including tunable strip elements whose strip design parameters are adjusted according to specific design rules so as to optimize the strip elements signal-to-noise ratio (SNR). The present invention also relates to apparatus, methods and NMR, MRI or MRS systems related thereto.

BACKGROUND OF THE INVENTION

Magnetic resonance imaging (MRI) is a technique that is capable of providing three-dimensional imaging of an object. A conventional MRI system typically includes a main or primary magnet that provides the main static magnetic field $B_o$, magnetic field gradient coils and radio frequency (RF) coils, which are used for spatial encoding, exciting and detecting the nuclei for imaging. Typically, the main magnet is designed to provide a homogeneous magnetic field in an internal region within the main magnet, for example, in the air space of a large central bore of a solenoid or in the air gap between the magnetic pole plates of a C-type magnet. The patient or object to be imaged is positioned in the homogeneous field region located in such air space. The gradient field and the RF coils are typically located external to the patient or object to be imaged and inside the geometry of the main or primary magnet(s) surrounding the air space. There is shown in U.S. Pat. Nos. 4,689,563; 4,968,937 and 5,990,681, the teachings of which are incorporated herein by reference, some exemplary MRI systems.

In MRI, the uniform magnetic field $B_o$ generated by the main magnet is applied to an imaged object by convention along the Z-axis of a Cartesian coordinate system, the origin of which is within the imaged object. The uniform magnetic field $B_o$ being applied has the effect of aligning the magnetization arising from the nuclei of the atoms comprising the imaged object, along the Z-axis, such nuclei possess a nuclear magnetization due to their having an odd number of protons or neutrons. In response to RF magnetic field pulses of the proper frequency, with field direction orientated within the XY plane, the nuclei resonate at their Larmor frequencies, $\omega=\gamma B_o$, where $\gamma$ is called the gyromagnetic ratio. In a typical planar imaging sequence, the RF signal centered about the desired Larmor frequency is applied to the imaged object at the same time a magnetic field gradient $G_z$ is being applied along the Z-axis. This gradient field $G_z$ causes only the nuclei in a slice of limited thickness through the object perpendicular to the Z-axis, to satisfy the resonant condition and thus be excited into resonance.

After excitation of the nuclei in the slice, magnetic field gradients are applied along the X- and Y-axes respectively. The gradient $G_x$ along the X-axis causes the nuclei to precess at different frequencies depending on their position along the X-axis, that is, $G_x$ spatially encodes the processing nuclei by frequency. Thus, this gradient is often referred to as a frequency encoding or read-out gradient. The Y-axis gradient $G_y$ is incremented through a series of values and encodes the Y position into the rate of change of the phase of the precessing nuclei as a function of gradient amplitude, a process typically referred to as phase encoding.

The quality of the image produced by the MRI techniques is dependent, in part, upon the strength of the magnetic resonance (MR) signal received from the precessing nuclei by the MRI detector. Loop surface coil detectors were adopted in the early 1980's for MRI from prior uses in NMR. There is described, for example, in U.S. Pat. No. 4,825,162 a surface coil(s) for use in MRI/NMRI imaging and methods related thereto. In the preferred embodiment of that invention, each surface coil is connected to the input of an associated one of a like plurality of low-input-impedance preamplifiers, which minimize the interaction between any surface coil and any other surface coils not immediately adjacent thereto. These surface coils can have square, circular and the like geometries. This yields an array of a plurality of closely spaced surface coils, each positioned so as to have substantially no interaction with all adjacent surface coils. A different MR response signal is received at each different one of the surface coils from an associated portion of the sample enclosed within the imaging volume defined by the array. Each different MR response signal is used to construct a different one of plurality of different images from each surface coil. These images are then being combined, on a point-by-point basis to produce a single composite MR image of a total sample portion comprised of the MR response signals from the entire array of surface coils.

The use of a phased array of RF coils or surface coils with a tuned and matched circuit including low impedance preamplifiers have been used to de-couple adjacent loops as a mechanism for improving the signal-to-noise ratio (SNR) and field of view (FOV). In this regard, it should be understood that the term "coupling" refers to the coupling of a signal (e.g., MR signal and/or noise signal and/or RF excite signal) in one coil to an adjacent coil(s), such that the signal being outputted by the adjacent coil is a combination of the signal detected by the adjacent coil and the coupled signal. Consequently, the image from the adjacent coil may be distorted or the SNR degraded to some degree. Although overlapping adjacent coil(s) and using low impedance pre-amplifiers have been effective in minimizing decoupling artifacts and SNR degradation, such circuitry becomes less effective as the number of coils and/or the coil density is increased. In particular, as the spacing between adjacent coils and between adjacent portions of a coil is decreased signal coupling effects increase and become less manageable by the various measures deployed to counter such effects.

There is found in U.S. Pat. No. 6,771,070 a new type of phased-array detector, a planar strip array (PSA), recently introduced for conventional and parallel spatially-encoded MRI. Instead of an array of conventional loop coils, the PSA consists of parallel conducting strips covered and separated from a virtual conducting ground plane by a low-loss dielectric substrate. Each strip serves as an individual detector and is connected to its own preamplifier. The strips are tuned by adjusting their lengths, L, and separation, h, from the ground plane to λ/4, λ/2, or multiples thereof, where λ is the electromagnetic (EM) wavelength at the MRI frequency. The original PSA exhibits important advantages over conventional loop-coil phased arrays. The mutual coupling between detectors is essentially eliminated, and the self-resonance frequencies of strips are intrinsically higher than loop detectors and can potentially outperform loops at frequencies where they are no longer tunable. This suits the PSA well for large arrays, massively parallel MRI, and high-frequency MRI [Zhang X, Ugurbil K, Chen W. Microstrip RF surface coil design for extremely high-field MRI and spectroscopy. Magn Reson Med 2001; 46: 443-450]. Because of the limited ability to adjust the substrate's dielectric properties in the original PSA, strip length is effectively fixed by tuning, and is therefore not a design parameter that can be flexibly adjusted to optimize the signal-to-noise ratio (SNR) performance for specific applications.

There is found in U.S. Pat. No. 7,088,104, a phased-array detector that includes a strip array antenna including a plurality or more of conductors and a plurality of reactive tuning components, where at least one of the plurality of reactive components is electrically coupled to each conductor as well as to ground/virtual ground. The apparent electrical length of the conductors is tuned with the reactive tuning components so the apparent electrical length of the conductor is equal to be about nλ/4, where n is an integer ≧1 and λ is the wavelength of the signal to be detected. In sum, n distributed lumped tuning elements were introduced to permit the λ/4 or λ/2 conditions to be met with strip lengths that can be selected based on the performance requirements of the specific application.

The intrinsic SNR (ISNR), defined as the SNR that a detector could achieve if the detector and MRI system losses are excluded [Edelstein W A, Glover G H, Hardy C J, Redington R W. The intrinsic signal-to noise ratio in NMR imaging. Magn Resort Med 1986; 3: 604-618], measures the potential SNR performance of a particular detector geometry, and therefore permits performance comparisons of different detector geometries. For example, in the quasistatic field limit, the geometry of the loop detector that produces the maximum ISNR has been determined both numerically [Roemer P B, Edelstein W A, Ultimate Sensitivity Limits of Surface Coils. Proc SMRM 6th Annual Meeting 1987; p. 410], and analytically [Chen C N, Hoult D I. Biomedical Magnetic Resonance Technology. Adam Hilger, 1989; 160-161]. Thus, for a region of interest lying at depth d in a semi-infinite planar sample of the sample portion of interest the loop geometry delivering the maximum ISNR has radius $$a=d/\sqrt{5} \quad \{Eq. 1\}$$

This relationship is central to optimizing SNR gains from head and body phased-arrays fabricated from individual loop coil elements. The MRI strip detector differs fundamentally from a conventional loop detector with respect to its geometry, field distribution, sensitivity profile, and that a larger portion of its energy, if activated, may be stored as E-field within the dielectric substrate close to the strip, compared to energy stored as B-field close to the loop. Accordingly, the strip detector exhibits spatial sensitivity and ISNR characteristics that are entirely different to loop detectors. Thus, the usual design rules for optimizing loop detectors are not applicable to MRI detectors embodying one or more strips.

Quadrature MRI detectors are comprised of elements whose principal RF magnetic field components are orthogonal or nearly-orthogonal, such that they can directly receive the circularly polarized MRI or MRS signals from a sample [Hoult, D. I., C. N. Chen, and V. J. Sank, *Quadrature detection in the laboratory frame*. Magn Reson Med, 1984. 1(3): p. 339-53; Chen, C., Hoult D I, Sank V J, *Quadrature Detection Coils—A Further sqrt(2) Improvement in Sensitivity*. Journal of Magnetic Resonance, 1983. 54: p. 324-327; Hyde, J. S., et al., *Quadrature detection surface coil*. Magn Reson Med, 1987. 4(2): p. 179-84; Bottomley, P. A., et al., *Proton-decoupled, Overhauser-enhanced, spatially localized carbon-13 spectroscopy in humans*. Magn Reson Med, 1989. 12(3): p. 348-63]. By combining the raw signals from a pair of quadrature elements with a hybrid that provides the appropriate 90° phase shift, or by means of a root-of-the-sum-of-the-squares combination of the processed signals, a quadrature detector coil can provide up to a √2-fold gain in the signal-to-noise-ratio (SNR) compared to coils of the same geometry used as linear detectors [Hoult, D. I., C. N. Chen, and V. J. Sank, *Quadrature detection in the laboratory frame*. Magn Reson Med, 1984. 1(3): p. 339-53; Redpath, T. W., *Quadrature rf coil pairs*. Magn Reson Med, 1986. 3(1): p. 118-9].

Quadrature surface coils comprised of a circular loop and a 'figure-8' or 'butterfly' coil with long axis perpendicular to the main magnetic field, $B_0$, have been adopted for both multi-nuclear MRS, and for commercial MRI phased-arrays in applications including the spine where their use with quadrature hybrids halves the number of MRI receiver channels required to service the array.

It thus, would be desirable to provide rules particularly suitable for a single tuned strip detector element of a tunable PSA as well as methods embodying the use of such rules. It would be desirable to provide detection devices that embody such rules as well as apparatuses and systems that embody such detection devices. It also would be desirable to provide quadrature hybrid detection devices that embody a surface coil and phased strip array antenna.

SUMMARY OF THE INVENTION

The present invention features a device for detecting or receiving magnetic resonance (MR) signals and more particularly a device for detecting nuclear magnetic resonance (NMR) signals from excited nuclei. Also featured are a detection apparatus embodying such a device, an MR excitation and signal detection apparatus embodying such a device, a magnetic resonance imaging (MRI) system embodying such a device and/or such an MR excitation and signal detection apparatus. Further featured are methods related to the above-described detection device, apparatuses and system.

The detection device includes a strip array antenna including at least one conductor or conductive strip and a ground or virtual ground, where the conductor or strip is tuned to resonate at the desired MRI frequency. In addition, each of the at least one conductor has a length that is substantially in the range of L=1.3 (±0.02) d, where d is the depth of interest.

In further embodiments, each of the at least one conductor includes at least one conducting strip that is separated and displaced relative to the virtual ground conducting member by a dielectric. More particularly, the conductive strip is tuned to resonate at a wavelength that is an integer multiple of one fourth of the electromagnetic wavelength when loaded with the sample undergoing MRI. In further embodiments, a width of the conductive strip is adjusted to substantially equal the spacing between the strip and the ground. For example, the quarter wavelength for a proton NMR in a 1.5 Tesla magnetic field in air is about 117 cm, which reduces to about 46 cm in a glass dielectric PSA (see Lee et al, Magn Reson Med 2001; 45: 673-683), and is effectively reduced and/or adjusted further in the conductive strips of the present invention through the use of the reactive components.

In more particular embodiments, the dielectric has a dielectric constant substantially equal to 1 and the detector further includes a second dielectric portion that is positioned so as to be disposed between the conductive strip and the sample being studied. In illustrative embodiments, the second dielectric portion is positioned immediately above the at least one conductive strip so as to separate the strip from the sample.

In further embodiments/aspects of the present invention, the strip array antenna includes a plurality of conductors that are arranged so as to be generally parallel to each other. In yet further embodiments, the strip array antenna includes a multiplicity, of elements for detecting MR signals, such as 4 or more, 16 or more, 32 or more or 64 or more elements so as to significantly reduce scan time, particularly when the array is in conjunction with parallel sensitivity encoding methods, such as SMASH, SENSE, ASP and the like. In yet further embodiments, the detection device includes a multiplicity of conductors in the range of from about 4 to about 32 conductors, more particularly in the range of from about 4 to about 16 conductors and further in the range of from about 16 to about 256 conductors.

Also, the strip array antenna includes N reactive tuning components or elements, where N is an integer $\geqq 1$. Such reactive tuning components or elements include for example a capacitor, an inductor or both. In exemplary embodiments, the reactive components or tuning elements are capacitors such as high-Q ceramic chip capacitors or variable capacitors such as those used by one skilled in the RF arts. Also, at least one of the N reactive tuning components is electrically coupled to each conductor or conductive strip and to one of ground or a virtual ground. In more particular embodiments, N is an integer $\geqq 2$ and two or more of the N reactive tuning components is electrically coupled to each conductor or conductive strip and to one of ground or a virtual ground, where the two or more reactive tuning components are distributed along the length of the conductive strip. In more particular embodiments, 2 or more, 3 or more, 4 or more, or 5 or more reactive components are electrically coupled to each conductor of the strip array antenna. In an alternative embodiment, each reactive component is configured so as to be adjustable to any one of a number of values within a range of values.

In further embodiments/aspects, each of the conductors has a length and each of the reactive components has a value set so that the combination of the conductor length and the reactance of the reactive component is such as to substantially reduce the coupling of a signal in one of the conductors to an adjacent conductor. In further embodiments, there are a plurality of grounds or virtual grounds (i.e., ground or virtual ground conducting members) for each of the plurality of conductors or conductive strips and the plurality of grounds or virtual grounds are interconnected to each other.

In yet further embodiments/aspects of the present invention, each conductive strip of the strip array antenna comprises a plurality of pairs of conducting strips and virtual ground conducting members. In further embodiments, the pairs of conducting strips and virtual ground conducting members are substantially parallel to each other. Also, the virtual ground conducting members are interconnected and each pair of conducting strips is separated from a neighbor pair by a distance of at least substantially equal to the spacing between a strip and its ground member In further embodiments/aspects, the at least one conductive strip and virtual ground are fabricated of a flexible material to conform to the shape of the sample. Also, in further embodiments/aspects such a detection device further includes a cable and decoupling mechanism, the decoupling mechanism be configured so as to effectively switch the detection device off during MRI excitation by a separate MRI excitation means. In more particular embodiments, the decoupling mechanism is operably coupled to the strip array antenna so as to decouple the conductive strips from an amplification means.

The ground plane or each of the ground plane sections is an electrical conductive material including, but not limited to, copper, aluminum or silver or a material that is plated with such exemplary conducting material.

The conductors also are made from any of a number of electrically conductive materials as is known to those skilled in the RF arts, including but not limited to, copper, aluminum and silver or gold or materials that include such conductive metals. The term conductor herein describes and includes any of a number of conductor shapes or arrangements as is known to those skilled in the art and thus are not particularly limited by the phrase strip array. Conductors or strips shall be understood to include conventional flat strips, wires, small diameter pipes (e.g., copper pipe), or conducting tape. Conductors or strips also shall be understood to include conductors or conductive material etched onto a printed circuit board or otherwise deposited onto a substrate.

In further embodiments, the electrical conductor for the ground plane/ground plane sections is a super-conducting material, or more specifically, comprised of those alloys known to those skilled in the art as being high-temperature superconductors. Also, the conductors or conducting strips are formed from a super-conducting material, or more specifically from those alloys know to those skilled in the art as being high-temperature superconductors. In the case where the ground plane and/or conducting strips are comprised of super-conducting material and where such material must be maintained at below room temperature in order to maintain the super-conducting properties, then the strip array is cryostatically encapsulated to maintain such temperature conditions, using non-magnetic encapsulating elements.

In other embodiments, the strip array antenna is one of a planar strip array antenna, an arcuate or curved strip array antenna, a flexible strip array antenna, or a cylindrical strip array antenna. In a specific embodiment, the plurality of conductors of the cylindrical or curved strip array antennas are configured so a long axis of each conductor extends axially or substantially parallel to the cylindrical axis. In another specific embodiment, the plurality of conductors of the cylindrical or curved strip array antennas are configured so each conductor extends substantially circumferentially or perpendicular to the cylindrical axis. In the case of the cylindrical strip array, each such circumferentially extending conductor can be further arranged so as to form a loop.

Also featured are a detection apparatus including a detection device as described above, and a plurality of receivers, one receiver for each conductor. In a more specific embodiment when using the detection apparatus in an MRI system, the detection apparatus further includes a plurality of transmit/receive (T/R) switching mechanisms (e.g., switches) one for each conductor/receiver path. The T/R switching mechanisms are configured and arranged so as to (a) de-couple each detection device conductor from its corresponding receiver during the period of time when an excitation EM signal is being applied to excite an NMR signal within an object of interest; (b) to de-activate each conductor during excitation by altering the impedance of each conductor so as to inhibit current flow that would otherwise generate fields that would counter the excitation field; and (c) following excitation, to permit coupling of each conductor with its corresponding receiver to conduct the detected MR signals to the MR system.

In further aspects of the present invention, there is featured a MRI system for acquiring MR image data using a detection device/apparatus of the present invention as described above. Such an system further include means for excitation such as a transmitter that generates the excitation EM (RF) signals or pulses, an antenna for transmitting these signals into at least the region of the imaged object to be scanned, and a controller that selectively controls signal transmission and signal reception so that each occurs at predetermined times and/or predetermined time intervals.

Such a system also further includes a main or primary magnet system that generates a homogeneous magnetic field in a predetermined region in which the object or portion thereof is to be imaged, gradient coils for generating one or additional magnetic fields, controllers for controlling the operation and energization of each of the main and gradient coils, the generation/transmission of the excitation EM (RF) signals and the acquisition/detection of MR signals by the detection system. Such a system further includes a processing apparatus that processes the data acquired so as to yield an image of the object that was scanned.

In further embodiments, a strip array that is optimized (i.e., length of conductor, the spacing of the conductor from a ground plane, its width, and the dielectric constant of the substrate adjusted to optimize MRI performance) is suitable for MRI transmission. Further such optimized arrays are integrated into MRI scanners.

Also featured are method for acquiring MR image data using such a detection device of the present invention as well as the for designing same to provide optimized SNR including adjusting length of the conductive strips and other such geometric and material properties so as to provide optimized SNR performance for the heart, the kidneys, the abdomen, the brain, the liver, the thyroid and the like.

Also featured is a detection device comprising at least one loop antenna and a strip array antenna as described above, arranged so as to form a hybrid quadrature detector.

Other aspects and embodiments of the invention are discussed below.

DEFINITIONS

The instant invention is most clearly understood with reference to the following definitions:

As used in the specification and claims, the singular form “a”, “an” and “the” include plural references unless the context clearly dictates otherwise.

As used herein, the term “comprising” or “including” is intended to mean that the compositions, methods, devices, apparatuses and systems include the recited elements, but do not exclude other elements. “Consisting essentially of”, when used to define compositions, devices, apparatuses, systems, and methods, shall mean excluding other elements of any essential significance to the combination. Embodiments defined by each of these transition terms are within the scope of this invention.

MRI shall be understood to mean magnetic resonance imaging (also sometimes referred to as Nuclear Magnetic Resonance Imaging—NMRI), and generally describes an imaging technique that involves the transmission of radio-frequency (RF) magnetic fields into a specimen (e.g., the patient’s body) while the specimen is subjected to a strong static magnetic field, wherein the RF magnetic field is tuned to excite the magnetic resonance frequency of a particular nuclear species of interest such as the nuclei of hydrogen (protons). The MRI/NMRI technique makes use of the fact that after the selected nuclei composing the specimen (e.g., hydrogen nuclei) are excited by the applied RF magnetic field, they “relax” back to equilibrium by emitting a RF magnetic field at the same frequency. The nucleus most commonly employed in magnetic resonance is the proton in the hydrogen atom, because the hydrogen nucleus has the largest magnetic moment for its spin, has the highest concentration in the body, and thus provides the strongest resonance signals. Other nuclei used include but are not limited to those of phosphorus (phosphorus-31), carbon-13, oxygen-17 and fluorine (fluorine-19). A computer analyzes the emissions from, for example, the hydrogen nuclei of water molecules in body tissues and constructs images of anatomic structures based on the concentrations of such nuclei.

The term specimen or subject shall be understood to mean any object other than the strip array antenna of the present invention, gradient magnetic coils and related structures that are placed in the main magnetic field for imaging (MRI) or spectroscopic (MRS) analysis and shall expressly include, but not be limited to members of the animal kingdom, including vertebrates (preferably a mammal, more preferably a human); test specimens, such as biological tissue, for example, removed from such members of the animal kingdom; and inanimate objects or phantoms which may be imaged by MR techniques, or which contain water or sources of other sensitive nuclei. Mammals include, but are not limited to, mice, monkeys, humans, farm animals, sport animals, and pets.

The term patient shall be understood to include mammalians including human beings as well as other members of the animal kingdom.

The term body coils shall be understood to include any antenna that generates a highly uniform RF magnetic field around the region of interest.

The term MR analysis shall be understood to include or embrace both imaging and spectroscopy (MRS) by producing chemical shift spectra.

USP shall be understood to mean U.S. patent Number, namely a U.S. patent granted by the U.S. Patent and Trademark Office.

BRIEF DESCRIPTION OF THE DRAWING

For a fuller understanding of the nature and desired objects of the present invention, reference is made to the following detailed description taken in conjunction with the accompanying drawing figures wherein like reference character denote corresponding parts throughout the several views, and wherein:

FIG. 1A shows parameters for a tuned λ/4 strip detector of length L with three lumped capacitors and FIG. 1B shows the strip, dielectric material and acrylic support, lumped capacitor, and ground plane. The strip of width W, is separated from the ground plane by dielectric material thickness h, and from the surface by a dielectric overlay of thickness g. The feed point is connected to a perfectly matched excitation source for numerical simulations, and directly to a matching circuit during experiments.

FIG. 4A shows a profile of numerical ISNR (FIG. 4B linear scale at bottom, same units as in FIG. 2) profile of an L=200 mm long strip with a strip width (W)-to-height (h) above substrate ratio, W/h=25/6, substrate dielectric constant $\in_r^{substrate}=1$ and number of tuning capacitors n=3, calculated along the length of the strip (horizontal z-axis) in the yz plane with y=0 at the top surface, and the strip oriented parallel to the z-axis. The sensitivity gradient follows the typical λ/4 wavelength pattern.

FIG. 10A-D are various illustrative views, where Fig. A is an experimental sagittal (yz-plane at x=0) pixel SNR (signal/rms noise, not ISNR) of the General Electric Company (GE) 3 inch (a=38 mm) loop coil and a 20 liter water phantom. FIG. 10B is an experimental sagittal SNR profile in; the middle (X=0 plane) of two L=20 cm, h=6 mm strip detectors that are spaced 5 cm apart at X=±2.5 cm on the same 20 liter water phantom [color contour intervals are at pixel SNR values of 500, 200, 100, 50, 30, and 10]. FIG. 10C is an example of sagittal fast spin echo (FSE) image of spine of healthy volunteer produced by the two-detector array (sequence repetition period TR=4000 ms, echo time TE=72 ms, number of excitation per frame NEX=2, 4 mm thick, field of view, FOV=28×28 cm, 256×192 points). FIG. 10D is an axial fast gradient echo (GRE) image of the water phantom (TR=100 ms, TE=3.2 ms, NEX=2,4 mm thick, field of view, FOV=28×28 cm, 256×192 points). The dotted line illustrates sinusoidal sensitivity profile for sensitivity encoding and extracting spatial image harmonics. The vertical line indicates the sagittal plane represented in part (b): the SNR is higher immediately above the strips.

FIG. 11 is a tabulation of a comparison of numerically- and empirically-determined tuning capacitors.

FIG. 12 is a tabulation of intrinsic SNR (ml $Hz^{1/2}$, upper figures, bold type) and raw pixel SNR (lower figures) for all experimental loop and strip detectors measured at the set of depths that correspond to the optimum theoretical (intrinsic) SNR for all of the strips and loops investigated in this study. The depth corresponding to the theoretical optimum for each detector is shaded. $Q_L$, and $Q_u$ are the loaded and unloaded coil Quality factors.

FIG. 13 is a tabulation of rules of thumb for designing λ/4 strip detectors with optimum ISNR.

FIG. 14A is a schematic view of quadrature detector positioned in the scanner coordinates that includes a strip array antenna (single conductive strip) and loop antenna.

FIGS. 14B-C are illustrative views of a weighted lumbar spine axial image using the phi-coil of the present invention (FIG. 14B) and for comparison the same anatomical region imaged with a figure '8' plus circular loop (FIG. 14C).

DESCRIPTION OF THE PREFERRED EMBODIMENT

The present invention features a device for detecting or receiving magnetic resonance (MR) signals and more particularly a device for detecting nuclear magnetic resonance (NMR) signals from excited nuclei. Also featured are a detection apparatus embodying such a device, an MR excitation and signal detection apparatus embodying such a device, a magnetic resonance imaging (MRI) system embodying such a device and/or such an MR excitation and signal detection apparatus. Further featured are methods related to the above-described detection device, apparatuses and system. As also indicated above, the present invention embodies strip antenna arrays and tuned strip antenna arrays such as those found in U.S. Pat. No. 6,771,070 and U.S. Pat. No. 7,088,104 whose teachings and descriptions are incorporated herein by reference. Thus reference shall be made to these patents as to the details regarding a strip array antenna, tuning of such a strip array using reactive components and other strip array antenna details that are not further detailed herein.

Figure 1A:
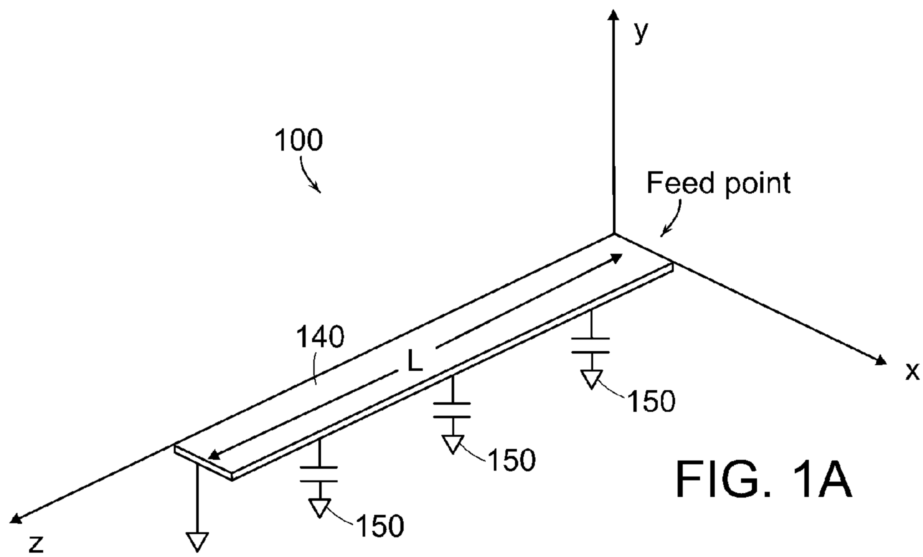
FIGS. 1A-B are diagrammatic and cross-sectional views respectively of a tuned strip detector according to an aspect of the present invention, where
Figure 1B:
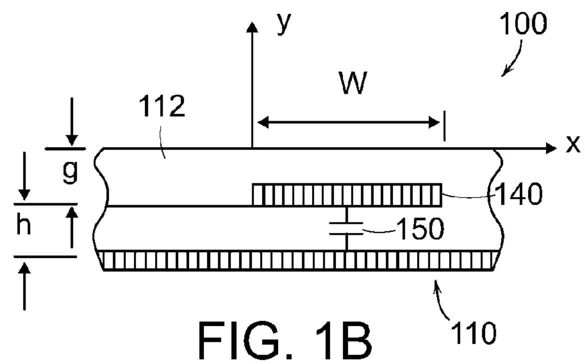

Referring now to FIGS. 1A-B, there are shown diagrammatic and cross-sectional views respectively of a detection device or strip array antenna 100 including at least one conductor 140 or conductive strip and a ground plane or virtual ground plane 110, where the conductor or strip is tuned to resonate at a desired MRI frequency. In addition, each of the at least one conductors 140 has a length that is substantially in the range of L=1.3 (±0.02) d, where d is the depth of interest in a sample, patient or subject being viewed. While the tuned strip array 100 is shown as having a single conductor or conductive strip 140, and three reactive components or elements 150 this shall not be construed as limiting the invention.

Figure 15:
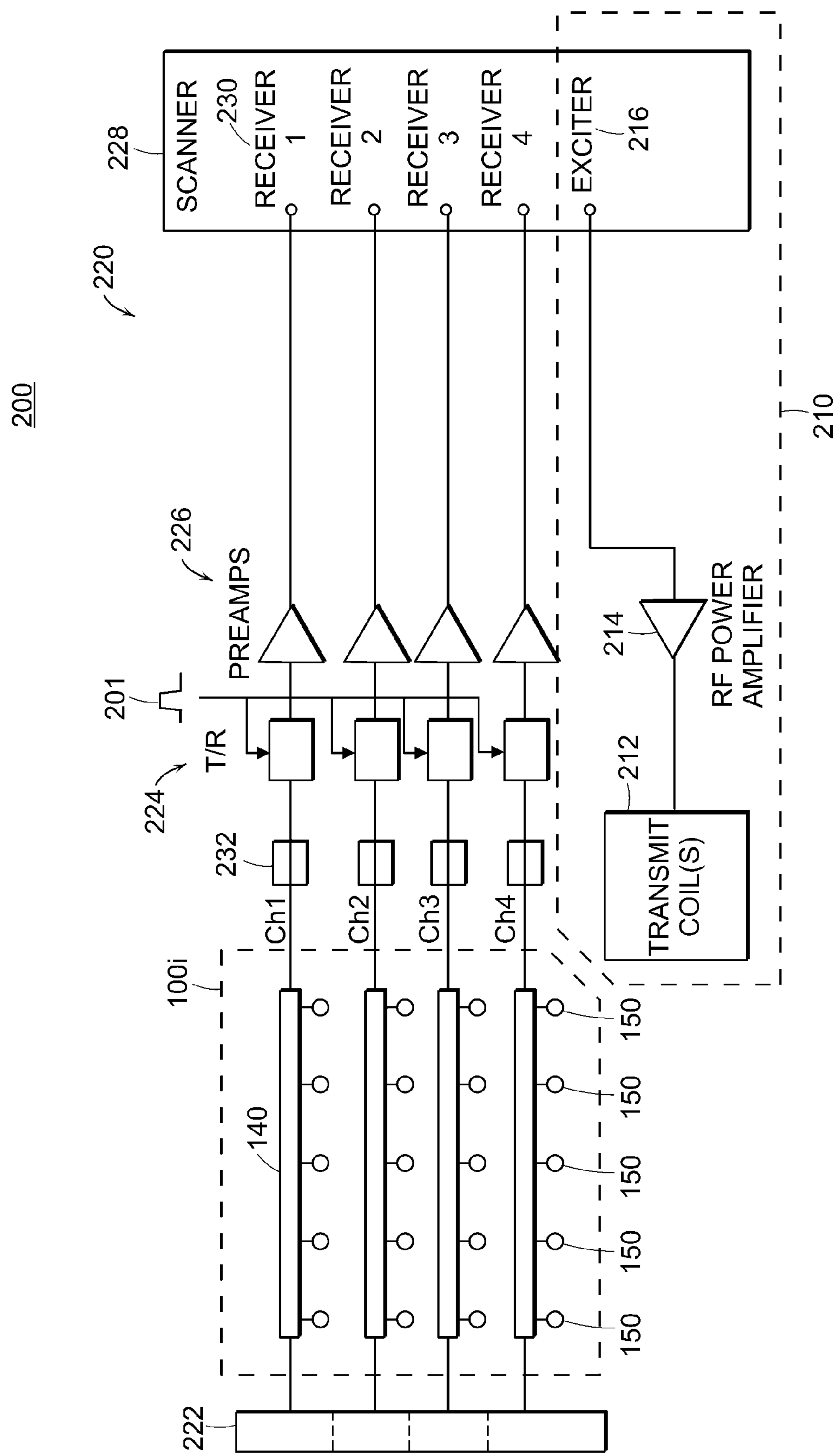
FIG. 15 is a schematic view of an exemplary RF excitation and MR signal detection apparatus of an MRI system for detecting MR signals of excited hydrogen nuclei.

As shown and described in U.S. Pat. No. 6,771,070 and U.S. Pat. No. 7,088,104, and as also shown in FIG. 15 herein, a strip array antenna 100 according to the present invention comprises N conductors 140, where N is an integer that is greater than or equal to 1. In yet further embodiments, the strip array antenna 100 comprises a plurality of conductors that are arranged so as to be generally parallel to each other, more particularly includes a multiplicity, of elements/conductors 140 for detecting MR signals, such as 4 or more, 16 or more, 32 or more or 64 or more conductors so as to significantly reduce scan time, particularly when the array is in conjunction with parallel sensitivity encoding methods, such as SMASH, SENSE, ASP and the like as is known to those skilled in the art. In yet further embodiments, the detection device includes a multiplicity of conductors in the range of from about 4 to about 32 conductors, more particularly in the range of from about 4 to about 16 conductors, in the range of from about 4 to about 256 conductors, in the range of from about 16 to about 32 conductors, and in the range of from about 16 to about 256 conductors.

In yet further embodiments/aspects of the present invention, each conductive strip 140 of the strip array antenna 100 comprises a plurality of pairs of conducting strips and virtual ground conducting members. In further embodiments, the pairs of conducting strips and virtual ground conducting members are substantially parallel to each other. Also, the virtual ground conducting members are interconnected and each pair of conducting strips is separated from a neighbor pair by a distance of at least substantially equal to the spacing between a strip and its ground member. Also, in further embodiments/aspects, the at least one conductive strip 140 and virtual ground 110 are fabricated of flexible material to conform to the shape of the sample specimen.

In further embodiments, each strip array antenna 100 includes n reactive tuning components 150 or elements, where n is an integer ≧1. Also, at least one of the n reactive tuning components 150 is electrically coupled to each conductor or conductive strip and to one of ground plane 110 or the virtual ground plane. In yet further embodiments, n is an integer ≧2, where two or more of the n reactive tuning components 150 are electrically coupled to each conductor or conductive strip and to one of the ground plane or virtual ground plane and where the two or more reactive tuning components are distributed along the length of the conductive strip. In more particular embodiments, 2 or more, 3 or more, 4 or more, or 5 or more reactive components 150 are electrically coupled to each conductor 140 of the strip array antenna 100. In alternative embodiments, each reactive component 150 is configured so as to be adjustable to any one of a number of values within a range of values.

In more particularly embodiments, the conductive strip is tuned to resonate at a wavelength that is an integer multiple of one fourth of the electromagnetic wavelength when the detector is loaded with the sample undergoing MRI. According to the broadest aspects of the present invention, and in the case where one or more reactive tuning components 150 are electrically coupled to each conductor strip 140, the length L, of each conductor strip 140 is first chosen to optimize the particular geometry of the sample and region of interest or organ to be imaged, namely the L is set so as to be generally equal to 1.3 (±0.2) of the specific depth, "d", or range of depths in the body or specimen being scanned. The value or characteristic value of each of the one or more reactive tuning components 150 is then adjusted so as to tune the pre-selected length of the conductor strip 140 so that the apparent electrical length of each conductor strip satisfies the above-described condition for wave strip array antenna. In this way, the value or characteristic value of the one or more reactive tuning components 150 tunes each conductor strip, 140, so that the strip, and thus the strip array antenna 100, is capable of detecting EM waves and/or NMR signals with a desired wavelength or frequency.

In further embodiments, a width of the conductive strip is adjusted to substantially equal the spacing between the strip and the ground. For example, the quarter wavelength for a proton NMR in a 1.5 Tesla magnetic field in air is about 117 cm, which reduces to about 46 cm in a glass dielectric PSA (see Lee et al, Magn Reson Med 2001; 45: 673-683), and is effectively reduced and/or adjusted further in the conductor strips of the present invention through the use of the reactive components.

The ground plane 110, as is known to those skilled in the art, is made of an electrical conductive material including, but not limited to, copper, aluminum, silver or gold or materials being plated with such conducting material. The ground plane 110 is applied or otherwise secured or attached to a surface of a substrate so that the least one conductor 140 is separated and displaced relative to the ground plane 110 by a dielectric 112. The ground plane 110 can be a unitary structure such as shown illustratively in FIG. 15 or it can comprise a plurality or more of sections, such as that shown in FIG. 1 herein and FIG. 8 of U.S. Pat. No. 7,088,104. In a specific, exemplary embodiment, the ground plane 110 is electrically connected to ground. Because the ground plane 110 typically would be electrically coupled to the MR system ground only via RF input lines and the system preamplifier inputs as discussed in connection with FIG. 15 herein, its potential at RF frequencies may differ from that of true ground, and therefore more strictly speaking would be considered a virtual ground. Thus, it should be understood that, hereinafter, the phrase ground when used to describe the potential of the ground plane 110 includes a ground plane at either of true or virtual ground or other potentials that may arise on it even though the ground plane is nominally grounded via input connection lines or effectively isolated, for example, by use of baluns on the input connection lines. When the ground plane 110 comprises a plurality or multiplicity of ground plane sections, the plurality or multiplicity of ground plane sections are preferably electrically coupled or interconnected to each other.

The conductors 140 also are made from any of a number of electrically conductive materials as is known to those skilled in the RF arts, including but not limited to, copper, aluminum and silver or gold or materials that include such conductive metals. The term conductor herein describes and includes any of a number of conductor shapes or arrangements as is known to those skilled in the art and thus are not particularly limited by the phrase strip array. Conductors or strips shall be understood to include conventional flat strips, wires, small diameter pipes (e.g., copper pipe), or conducting tape. Conductors or strips also shall be understood to include conductors or conductive material etched onto a printed circuit board or otherwise deposited onto a substrate, which can be rigid or flexible, for example, in order to accommodate the curvature of a body or limg being imaged.

In further embodiments, the electrical conductor for the ground plane/ground plane sections is a super-conducting material, or more specifically, comprised of those alloys known to those skilled in the art as being high-temperature superconductors. Also, the conductors or conducting strips are formed from a super-conducting material, or more specifically from those alloys know to those skilled in the art as being high-temperature superconductors. In the case where the ground plane and/or conducting strips are comprised of super-conducting material and where such material must be maintained at below room temperature in order to maintain the super-conducting properties, then the strip array is cryostatically encapsulated to maintain such temperature conditions, using non-magnetic encapsulating elements.

Such reactive tuning components 150 or elements include for example a capacitor, an inductor or both. In exemplary embodiments, the reactive components or tuning elements are capacitors such as high-Q ceramic chip capacitors or variable capacitors such as those used by one skilled in the RF arts.

As more particularly described in U.S. Pat. No. 7,088,104, in yet further embodiments, the strip array antenna 100 is one of a planar strip array antenna, an arcuate or curved strip array antenna, a flexible strip array antenna, or a cylindrical strip array antenna. In a specific embodiment, the plurality of conductors 140 for a cylindrical or curved strip array antennas are configured so a long axis of each conductor extends axially or substantially parallel to the cylindrical axis. In another specific embodiment, the plurality of conductors of the cylindrical or curved strip array antennas are configured so each conductor extends substantially circumferentially or perpendicular to the cylindrical axis. In the case of the cylindrical strip array, each such circumferentially extending conductor can be further arranged so as to form a loop.

The dielectric 112 is any of a number of materials known to those skilled in the art and otherwise appropriate for the intended use. In illustrative embodiments, the dielectric material comprises any of number of materials know to those skilled in the art including but not limited to air. In exemplary embodiments, the dielectric 112, has a dielectric constant that is substantially equal to 1.

There is described hereinafter the application of a numerical electromagnetic Method of Moments (MoM) to determine the length, width, substrate thickness, dielectric constant, and number of tuning elements that yield an optimal intrinsic SNR (ISNR) of the strip detector, for example but not limited to, 1.5 Tesla, as well as providing a comparison of strip array antenna performance with that of a conventional optimized loop coil. The following also validates the numerical method against the known ISNR performance of loop coils, and its ability to predict the tuning capacitances and performance, of seven experimental strip detectors of varying length, width, substrate thickness and dielectric constant. As shown in the following the ISNR of strips is comparable to that of loops: higher close to the detector but lower at depth. The SNR improves with two inherently-decoupled strips, whose sensitivity profile is well-suited to parallel MRI. The findings are summarized in FIG. 13.

More specifically in the following, we have numerically analyzed the dependence of the ISNR of a single strip element on the parameters L, h; W, $\in_r$, and n. Using the Reciprocity Principle, the ISNR is calculated for a tuned strip loaded with a homogeneous sample possessing EM properties similar to that of the human body. The electric and magnetic fields are computed by solving the mixed potential integral (MPI) field equations employing the Method of Moments (MoM), which has been widely applied for computing the fields in objects whose size is comparable or smaller than the wavelength (12-14). Computations are iterated over a practical range of design parameters to derive a 'recipe' that optimizes the strip's ISNR performance at a given sample depth. Several MRI strip detectors were fabricated and their ISNR performance measured to test the validity of the numerical simulations. Finally, the SNR performance of the optimized strip and a pair of strips is compared with that of a conventional loop, both experimentally and theoretically.

Methods

Numerical Analysis

The voltage ISNR in MRI can be written as:

$$ISNR = \frac{V_{sig}}{V_{noise}} = \frac{\omega_0 \Delta V M_0 |B_t|}{\sqrt{4kT\Delta f R_L}}, \quad \text{\{Eq. 2\}}$$

where $V_{sig}$ and $V_{noise}$ are the peak signal amplitude and the rms noise voltages, $\omega_0$ is the Larmor frequency in rad/sec, $\Delta V$ is the voxel volume, $M_0$ is the magnetization, $B_1$ is the rotating component of the transverse RF magnetic field produced by the strip with one ampere of current at the terminals, k is Boltzmann's constant, T is the absolute temperature, $\Delta f$ is the receiver bandwidth (the bandwidth of the anti-aliasing filter used for acquiring the MRI signal), and $R_L$ is the noise resistance of the sample-loaded detector. Thus, ISNR is proportional to the ratio, $B_t/\sqrt{R_L}$. In an ideal detector in which the coil losses are negligible compared with those in the sample, the noise resistance $R_L$. is proportional to the power loss in the sample volume (17). In this case, $$R_L \propto \int_V |\overline{E}|^2 dV \quad \text{\{Eq. 3\}}$$

where $\sigma$ is the conductivity of the sample medium, and $\overline{E}$ is the electric field intensity in the sample volume and thesummation is defined over the sample volume of interest.

Method of Moments (MoM)

The numerical analysis was performed with FEKO solver (EM software and systems, South Africa) software employing special Green's function techniques for multilayer substrates. Candidate conducting strips are subdivided into $N_J$ triangular patches for the MoM formulation assuming a uniform surface current density ($J_s$) distribution in each triangular patch, with EM fields resulting from the impressed voltage source denoted as $\overline{E}$ and H. For a perfectly conducting strip the electric field integral equation (EFIE) is based on superposition of impressed (subscript i) and scattered (subscript s), E-fields. In the plane of the strip:

$$\overline{E}_{strip}=\overline{E}_s+\overline{E}_1=0 \quad \text{\{Eq. 4\}}$$

Triangular meshing on strips for electric surface current density ($J_s$) uses Rao-Wilton-Glisson basis functions with expansion coefficients $\alpha_n$:

$$\vec{J}_s = \sum_{n=1}^{N_j} \alpha_n \cdot \vec{f}_n \quad \text{\{Eq. 5\}}$$

where $N_J$, represents the number of triangular patches. Similarly, metallic wires connecting capacitors to ground are discretized into electrically small wire segments. Overlapping triangular basis functions $g_n$, are used to model the line current I along these wire segments with expansion coefficients $\beta_n$, such that:

$$I = \sum_{n=1}^{N_l} \beta_n g_n \quad \text{\{Eq. 6\}}$$

where $N_l$ represents the number of wire segments.

The EFIE expressed in compact form in Eq. 4, is solved using the MoM as a Galerkin method in which the expansion and testing functions are both considered as surface patches Eq. 5 and wire attachments Eq. 6. The currents are solved from a linear combination of $N=N_J+N_J$ expansion functions in a system of linear equations. After the current distribution is determined, the impedance and power losses are calculated. The net magnetic field at each point in space is the phasor sum of the field produced at that point by the current in each mesh element. Computation of its transverse component divided by the square-root of the power loss with one ampere current at the excitation source, then yields a measure that is directly proportional to ISNR.

For the EM simulations, candidate conducting strips are first numerically tuned to λ/4 at an MRI frequency of 63.87 MHz (1.5 T). Resonance is achieved by terminating one end to the ground plane while maximizing the input impedance at the feed point. The magnitude of $B_t$ is calculated from the root of the sum of the squares of the net transverse field components generated by the unit current applied at the feed point, with strips oriented parallel to the z-axis of the main magnetic field. The noise resistance, $R_L$, in Eq. 3 could be calculated by integrating the E-field over the entire sample volume. However, $R_L$ is more efficiently determined from the input impedance of the strip with one amp. source. Because it yields comparable results about 100 times faster in our implementation, this approach was used.

Figure 1C:
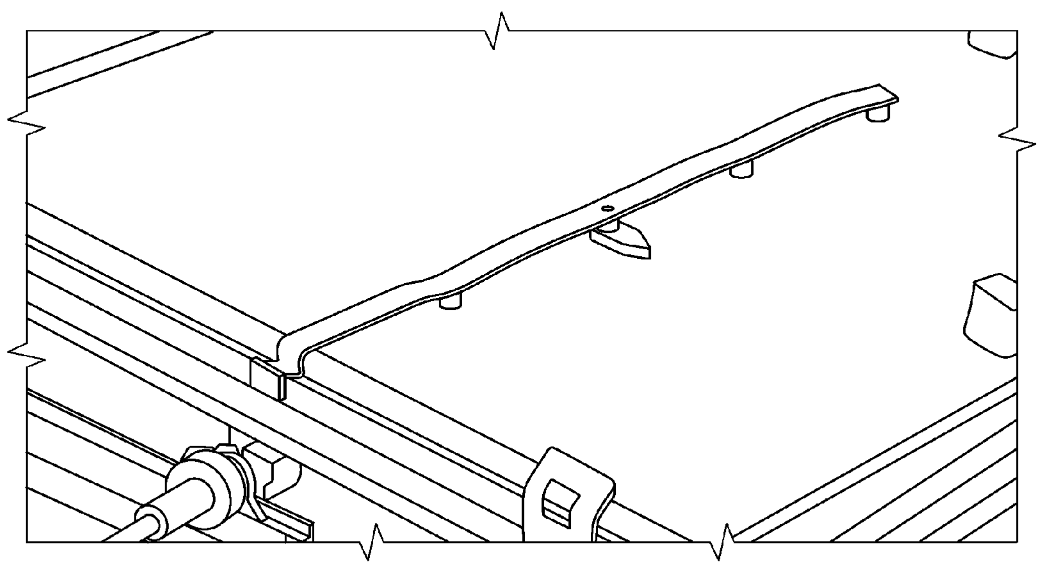
FIG. 1C is an illustrative view showing a single 20 cm strip detector element with coaxial cable attached for impedance measurement.

We consider λ/4 wavelength strip detectors, each embedded in a dielectric material of $\in_r=\in_r^{substrate}$, with one end connected to a unit current excitation source that is perfectly matched to the strip impedance, and the other end terminated to the conducting ground plane as depicted in FIG. 1. In all cases, both the dielectric and the height between the strip and ground (h), and that between the strip and the upper dielectric layer (g), is the same (h=g) except where an air dielectric ($\in_r=1$) is used. The loss tangent, tan δ, was assumed to be 0.001, typical of dielectric substrates and corresponding to negligible conductivity at RF frequencies. In the case of an air dielectric between the strip and ground plane, the gap g included the height h plus a 3 mm thick acrylic sheet ($\in_r=2.6$) to provide mechanical support and to insulate the sample from the conductor.

For the numerical calculations we assume a sample comprised of a homogeneous semi-infinite plane of muscle tissue with dielectric constant $\in_r^{sample}=77$ and conductivity σ=0.34 S/m at 63.9 MHz, as measured previously (20), laid on top of the detector. We assume that the ground plane is perfectly conducting and that both the ground plane and the strip have infinitesimal thickness.

The cable feed point is modeled as a uniform vertical current segment of length h. Surface currents are induced on the topside of the ground plane, on both sides of the metallic strip, and on the wire segments connecting the lumped capacitors to the ground plane. To determine the surface currents on the strip, the strip is divided into triangular patches with sides of length δ<0.01 λf where λf is the free space wavelength at the MRI frequency. All calculations are performed on an Intel P4 personal computer (2 GHz CPU, 512 MB RAM) with 72 (L=10 cm, W=6 mm) to 512 (L=20 cm, W=25 mm) triangular elements in the strip. $B_t$ is calculated over a selected plane or a point in the sample.

Numerical Validation

Figure 2:
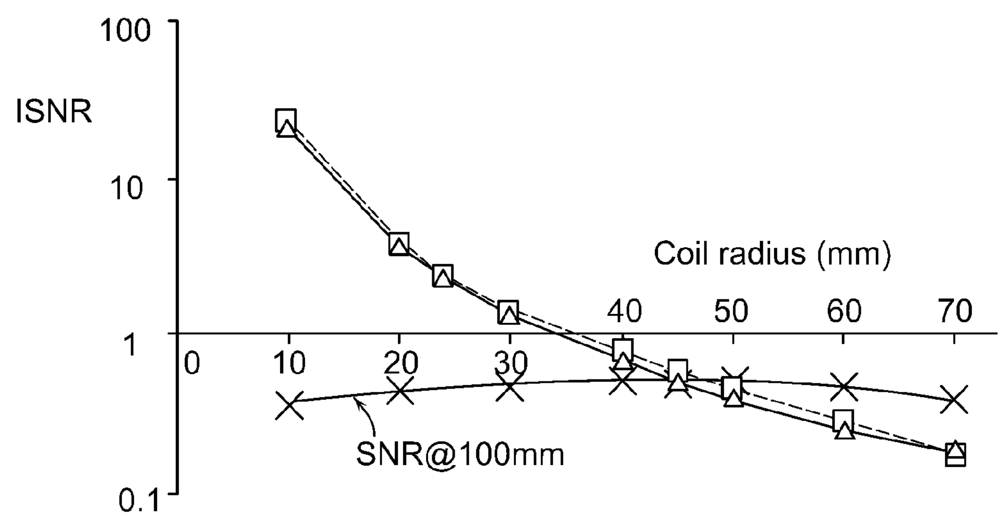
FIG. 2 is a graphical view of the intrinsic signal-to-noise ratio (ISNR, arbitrary units, log scale) versus coil radius, more specifically the ISNR of loop coils of radii 10 mm to 70 mm at their optimal depths relative to the conductor at y=0, calculated on axis numerically (squares), and using the analytical solution (Eq. 1; triangles, overlapping), as a function of coil radius (top curves). The analytical values were normalized to the single numerical value of the ISNR at an optimal depth of 22 mm for a 20 mm radius loop. The numerical ISNR at a fixed depth d=100 mm is also plotted as a function of coil radius in the solid curve (crosses, bottom). This curve shows that 45 mm radius coil produces the maximum ISNR at a depth of 100 mm, as expected from the analytical expression for optimal loop.

The numerical method is tested by applying it to calculate the ISNR of loop coils of radii from 10-70 mm, and comparing the results with the known analytical behavior computed from Eqs. 1 and 2. The ISNR for each loop, measured at its optimal depth is plotted as a function of the radius in FIG. 2. The overlaps of the curves over several orders-of-magnitude of the ISNR engenders confidence that our numerical analysis technique of (i) tuning each detector, (ii) calculating its $B_t$, and (iii) determining $R_L$ from the power losses, yields, in toto, results that are in agreement with prior analytic findings for the loop. The numerically calculated ISNR at 100 mm depth is also plotted as a function of coil radius in FIG. 2, demonstrating that. ISNR is indeed maximum for a 45 mm radius loop, as predicted by Eq. 1.

Numerical Optimization

To determine the strip design parameters that yield the optimum ISNR, rigorous numerical MoM ISNR calculations are performed for a large number of individual strips incorporating a wide range of the five design parameters, W, h, $\in_r^{substrate}$, n, and L. After tuning each strip, ISNR data for each strip are computed over a two-dimensional (2D) section lying perpendicular to the ground-plane and intersecting the long axis of the center of the strip. Signals at representative points at z=0.75 L lying directly above the center of the strips are selected for comparison. To condense the number of variables being simultaneously optimized, the ratio substrate W/h, is substituted for W with h=5 mm, 10 mm and 15 mm. The ISNR dependence on $\in_r^{substrate}$ is computed over the range of 1 to 10 and L was varied from 50 mm to 300 mm.

The ISNR of numerically-optimized strip detectors that result from the above procedure are then compared directly with the numerical ISNR of single loop coils computed using identical, sampling properties. In addition, to permit absolute comparisons of numerical ISNR and the experimental ISNR of loops and strips, numerical ISNR was converted to absolute values in $ml^{-1}\ Hz^{1/2}$ using Eq. [2] and $M_0$=0.00326 $Am^{-1}\ T^{-1}$ for water (10), with values of T, Δf and ΔV corresponding the experiment. Recognizing that a section through a loop intersects two (ungrounded) conductors compared to the single conductor of a strip detector, a two-strip detector may arguably provide a fairer ISNR comparison with the loop. Therefore, the SNR performance for the loop is also compared experimentally with that of a detector comprised of two parallel optimized strips.

Experimental Validation

Figure 3:
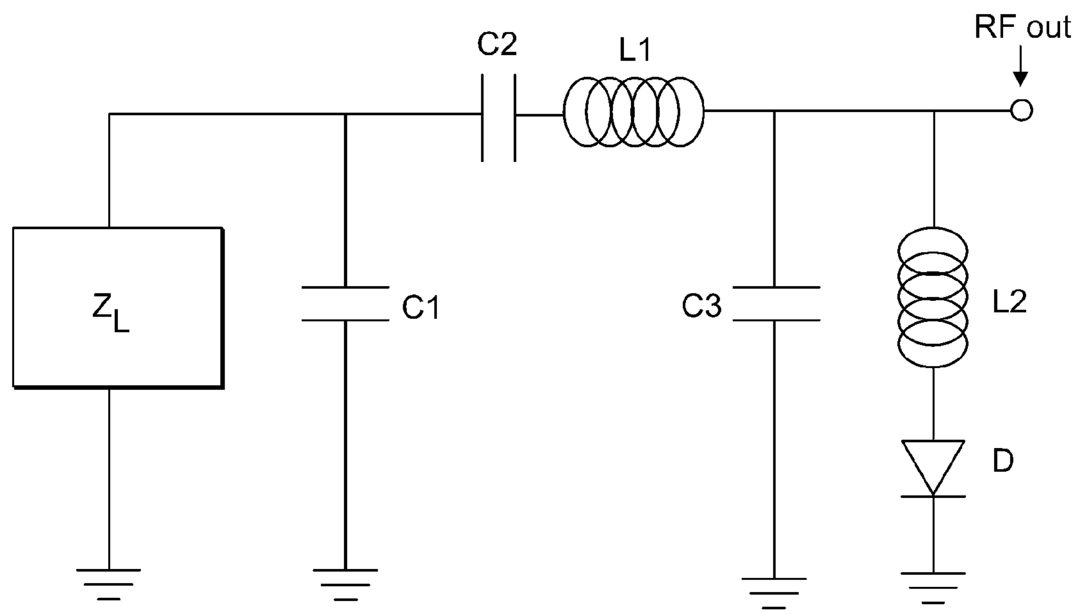
FIG. 3 is a schematic view showing the high Q matching circuit for strip detectors. C1, L1, C3 are impedance matching elements; C2 is DC blocking capacitor; L2 and the pin diode D, function as decoupling elements. The ranges of values used for our experimental strip detectors are: C1, 25-30 pF; C2≈1000 pF; C3, 120-200 pF; L1 250-300 nH; L2 20-40 nH. 50 Ohms coaxial cable attachment point at RF out.

To test the findings of the numerical analysis, seven single strip detectors tuned to λ/4 at 63.87 MHz with L=10 cm (W/h=1), 15 cm (W/h=1; using air with $\in_r^{substrate}$=1 and epoxy glass with $\in_r^{substrate}$=5), 20 cm (W/h=1, 2, and 4; air dielectric), and 30 cm (W/h=1; air dielectric) were fabricated. A copper-clad printed circuit board is used as a ground plane with copper tape (3M Corporation, MN) for the strips. Ceramic chip capacitors (American Technical Ceramics Inc, CA) serve as lumped elements to tune the detectors. The conducting strip and acrylic sheet in detectors employing air dielectrics are supported with acrylic rods. The two-strip detector for the loop coil comparison is fabricated with L=20 cm strips and h=6 cm, separated by 5 cm in an air gap $\in_r^{substrate}$=1). All strips are accurately tuned and matched (reflection coefficient, Γ<0.1) to a 50 Ω coaxial cable connected to the scanner receiver chain via the high-Quality Factor (Q) capacitor/inductor matching circuit illustrated in FIG. 3. To test the numerical tuning algorithm, the experimentally-determined tuning capacitances are compared with the numerically-determined values.

The ISNR performance of strip detectors is compared with commercial GE Medical Systems (Milwaukee, Wis.) loop coils of diameter 14 cm (5.5") and 7.6 cm (3"). The pixel and system SNR, as well as the ISNR performance, are measured for each detector loaded with a 20 liter cubic phantom of CuSO4-doped 0.35% NaCl solution. Experiments are performed with a GE 1.5T CV/i MRI scanner employing a gradient refocused echo (GRE) pulse sequence (TR=100 ms, TE=3.2 ms, NEX=2; flip angle=90°; 10 mm slice thickness). Image (pixel) SNR is derived from the ratio of the signal level at a given depth d to the offset-corrected root-mean-square (rms) of the background noise in the same image. The system noise figure for the scanner is measured from the ratio of the rms noise of a 50 Ω resistor measured at ambient and at liquid nitrogen temperatures while connected to the preamplifier and scanner (21). With TE<<$T_2$ and TR>>$T_1$, for the phantom, the system and ISNR did not require correction for relaxation effects. The loaded and unloaded Qs for the ISNR calculations were measured on a Hewlett Packard HP 23605 network analyzer equipped with an impedance test module.

Results

Figure 4A:
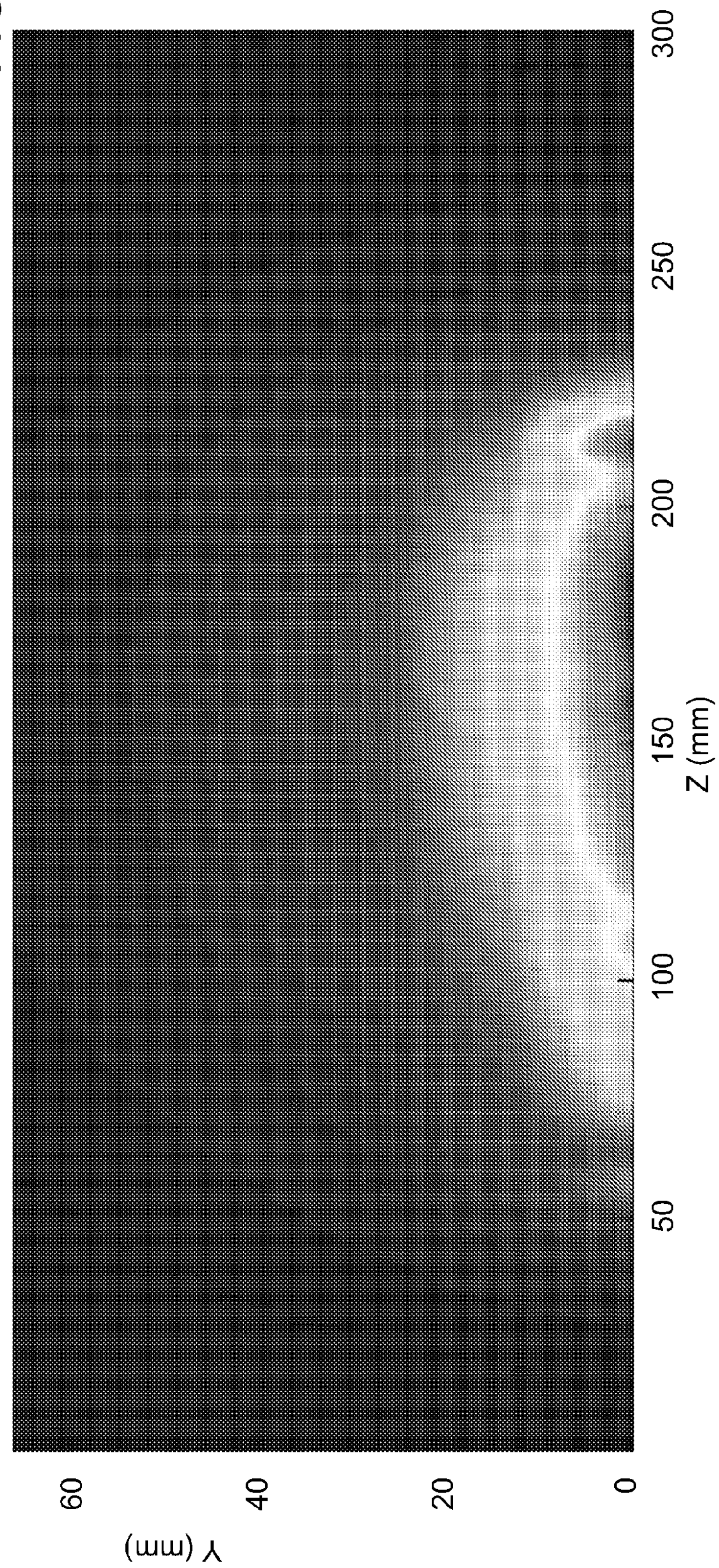
FIGS. 4A,B are illustrative views of ISNR where
Figure 4B:
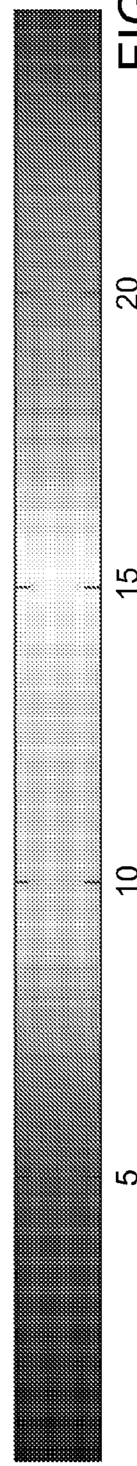
FIG. 4C is an illustrative view showing current density distribution along the strip length on the triangular surfaces of the 200 mm strip in FIG. 4A, depicting the 536 triangular patches. Logarithmic surface current density from 2 A/m (light blue) to 4 A/m (red).
Figure 4C:
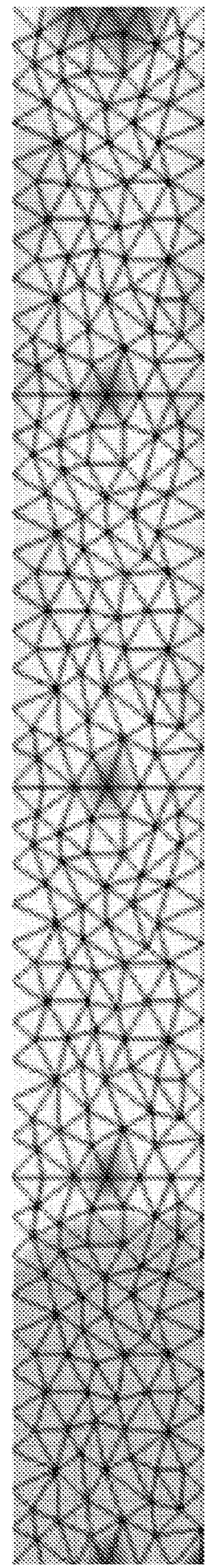

A computed 2D plot of the ISNR of a single λ/4 strip detector with L=100 mm, $\in_r$=1, h=6 mm, W=6 mm, tuned with n=three 68.4 pF capacitors is shown in FIGS. 4A-C. Note the sensitivity gradient from end-to-end, which is intrinsic to the original λ/4 design. In practice, the ranges of W, h, $\in_r$, n, and L that could be evaluated are limited by the practical constraint that strips must be tuned. As L is increased, for example, the net capacitance needed to tune a strip is increasingly dominated by the strip inductance and substrate capacitance, reducing the effect of the lumped elements (see FIG. 11). Eventually, the distributed substrate capacitance becomes so large that strips cannot be effectively tuned with additional lumped capacitors.

ISNR Dependence on Dielectric Constant

Figure 5A:
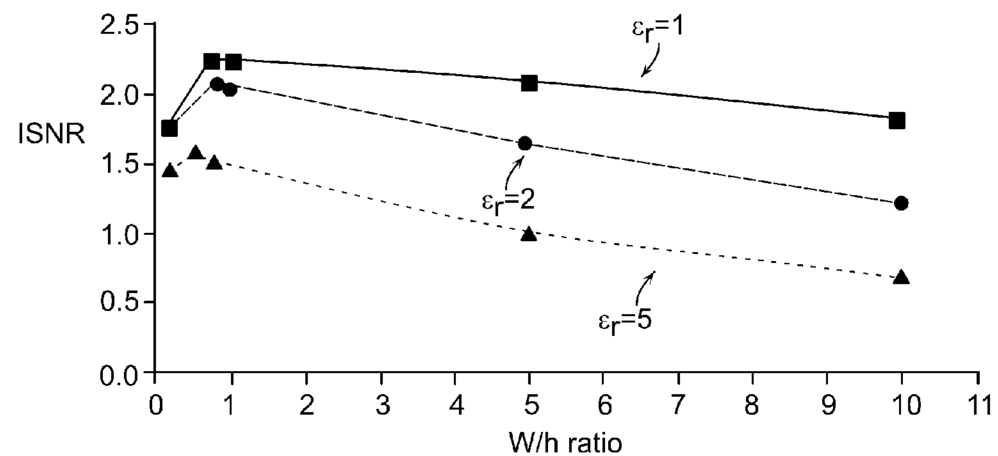
FIG. 5A is graphical view of ISNR versus W/h ratio more particularly showing ISNR (same units as in FIG. 2) for h=5 mm, L=150 mm strip detectors calculated at (x, y, z)=(0, 50 mm, 100 mm) as a function of W/h for three dielectric substrates with $\in_r$=1, 2, 5 as labeled. The signal-to-noise ratio, SNR is higher with air dielectric compared to an all-acrylic ($\in_r \approx 2$) and epoxy glass (printed circuit board substrate, FR4 with $\in_r=5$) substrates, and declines slowly with W/h ratio.
Figure 5B:
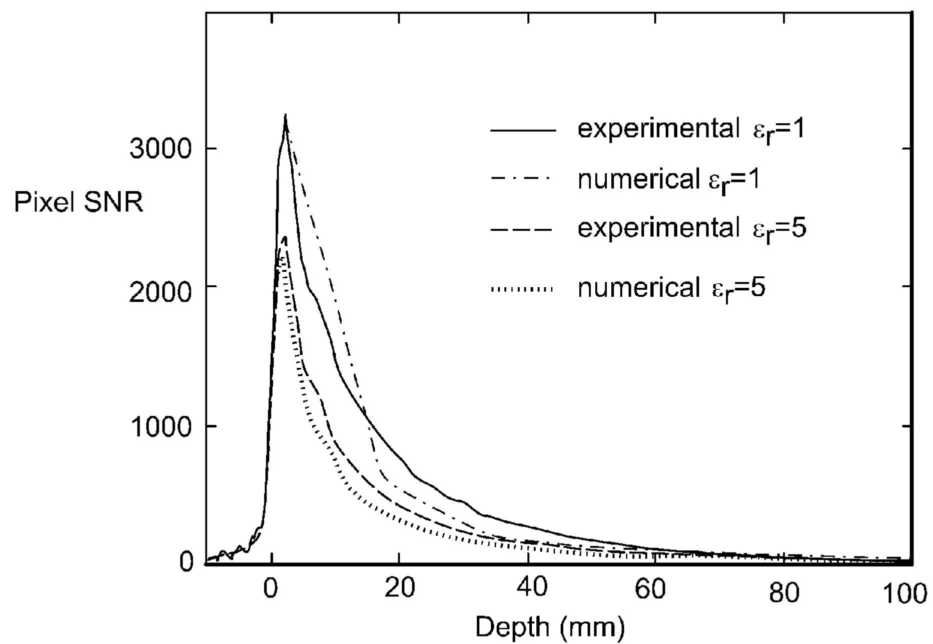
FIG. 5B is a graphical view showing experimental and numerical SNR plotted as a function of depth for two h=5 mm, L=150 mm strips fabricated from substrates with $\in_r=1$ (air): and $\in_r=5$ (epoxy glass), as annotated. The numerical curves are, normalized to the (single) peak value of the experimental curve.

The calculated ISNR as a function of W/h with h=5 mm at a depth of 50 mm is plotted in FIG. 5A for three strips with L=150 mm and substrate dielectric constants of 1, 2 and 5. The corresponding ISNR as a function of depth for the 150 mm strip made with epoxy glass ($\in_r^{substrate}$=5) and air ($\in_r^{substrate}$=1) are shown in FIG. 5B. The calculated ISNR is nearly 50% lower with the epoxy glass substrate compared to the air dielectric. This result is essentially independent of W/h. The numerical analysis supports a finding that ISNR decreases as $\in_r^{substrate}$ increases above unity for the range $1 \leqq \in_r^{substrate} \leqq 10$ investigated. This numerical finding is not due to losses in the dielectric per se, because neither a 10-fold increase nor reduction in the dielectric loss tangent significantly affects the calculated ISNR values. It appears that as $\in_r^{substrate}$ decreases, the magnetic field (signal) in the sample increases faster than the square root of the noise. From this it appears that air or vacuum is best.

This finding is consistent with the experimental pixel SNR data from the $\in_r^{substrate}$=1 and $\in_r^{substrate}$=5, 150 mm long strips, whose SNR curves also plotted in FIG. 5B and overlap the calculated curves.

ISNR and the Number of Tuning Capacitors

Provided that the strips are tuned to λ/4, increasing the number of capacitors from 1 (located at the strip center) to 10 (equally-spaced) did not significantly affect strip ISNR. In contrast to loops wherein capacitance values increases as the number of distributed elements increases, the capacitance values needed to tune strips to λ/4 decreases both as the number of capacitors increases and as strip length increases, to counteract the increasing contribution from the dielectric substrate. The tabulation in FIG. 11 compares the experimentally determined capacitor values needed to tune the strips with capacitance values computed using 72-512 triangular surface patches in the MoM formulation. The excellent agreement between calculated and experimental tuning capacitances is within the accrued 5% tolerances of the chip capacitors used, and validates the practical performance of the numerical tuning algorithm.

ISNR Dependence on W/h, h, and W

Figure 6A:
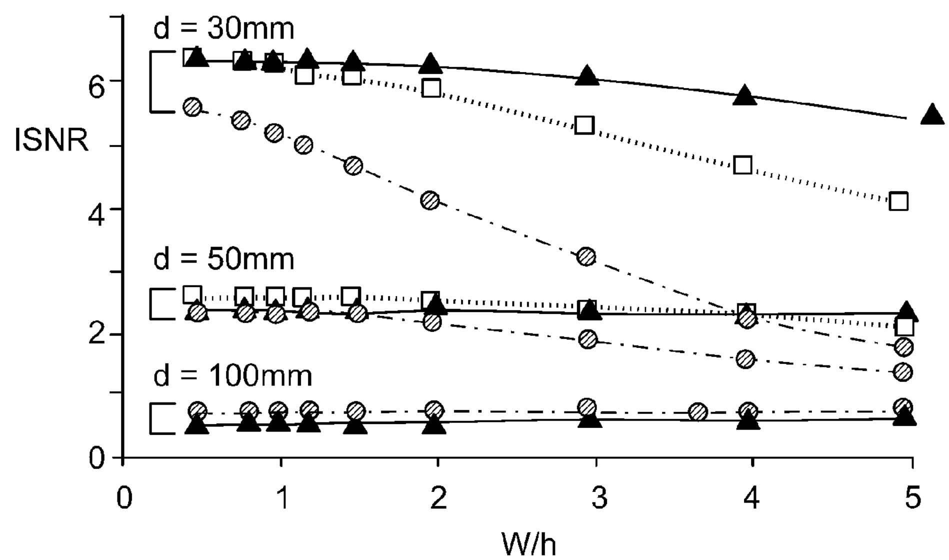
FIG. 6A is a graphical view of numerical ISNR (same units as in FIG. 2) as a function of W/h for h=5 mm (triangles), 10 mm (grey squares), and 20 mm (circles) at depths y=30 mm, 50 mm, and 100 mm for L=100 mm strips. ISNR is reduced as h increases at lower depths.
Figure 6B:
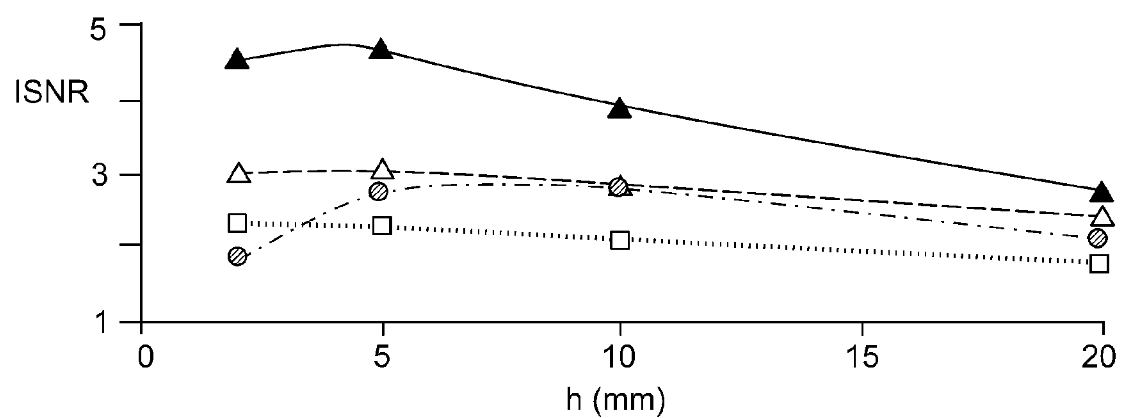
FIG. 6B is a graphical view of numerical ISNR as a function of h at a depth d=30 mm above the top surfaces of detectors with $\in_r=1$ (triangles) and $\in_r=5$ (squares) dielectrics with (filled symbols) and without (empty symbols) the upper dielectric layer (L=200 mm, W=10 mm).

In FIG. 6A, the computed ISNR of a strip of L=100 mm with air dielectric ($\in_r^{substrate}$=1 plus an acrylic sheet) is plotted as a function of W/h at depths 30 mm, 50 mm and 100 mm with three different values of h (5 mm, 10 mm and 20 mm). As in FIG. 5A, the ISNR declines slowly with W/h>1 for h=5 mm. However, here we see that ISNR declines more severely as h increases, albeit only at shallow depths: at 100 mm depth, for example, the decrease in ISNR is less than 5% over the range $0.5 \leqq W/h \leqq 5$ for all strips with lengths 50mm $\leqq L \leqq$ 300 mm. Note that because detectors are designed with equally thick layers of dielectric above and below the conductor, and depth is measured from the top of the detector, the distance between the conducting strip and the sample increases with h. This raises the question of whether the ISNR reduction with h is due to the increased distance between the strip and sample. The effect on ISNR of removing the upper dielectric layer entirely, except for the 3 mm acrylic sheet which is used for mechanical support and/or electrical insulation, is shown in FIG. 6B at a fixed depth above the acrylic, for air and epoxy-glass substrates. Removing the upper dielectric layer (including air dielectric) reduces ISNR, despite the reduction in distance between sample and strip. Thus, the inclusion of the upper dielectric is important to strip performance, and is not responsible for the ISNR decline with h.

Figure 7A:
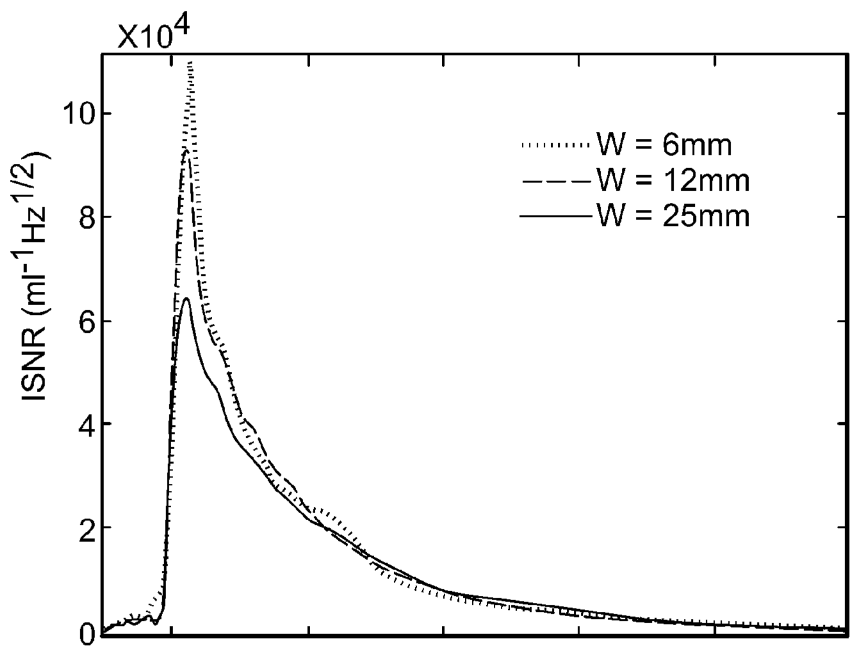
FIG. 7A is a graphical view of experimentally measured ISNR for L=20 mm, h=6 mm, and $\in_r=1$ strips, as a function of depth for W=6, 12, and 25 mm. Wider strips show some ISNR improvement at depths of 10-60 mm.
Figure 7B:
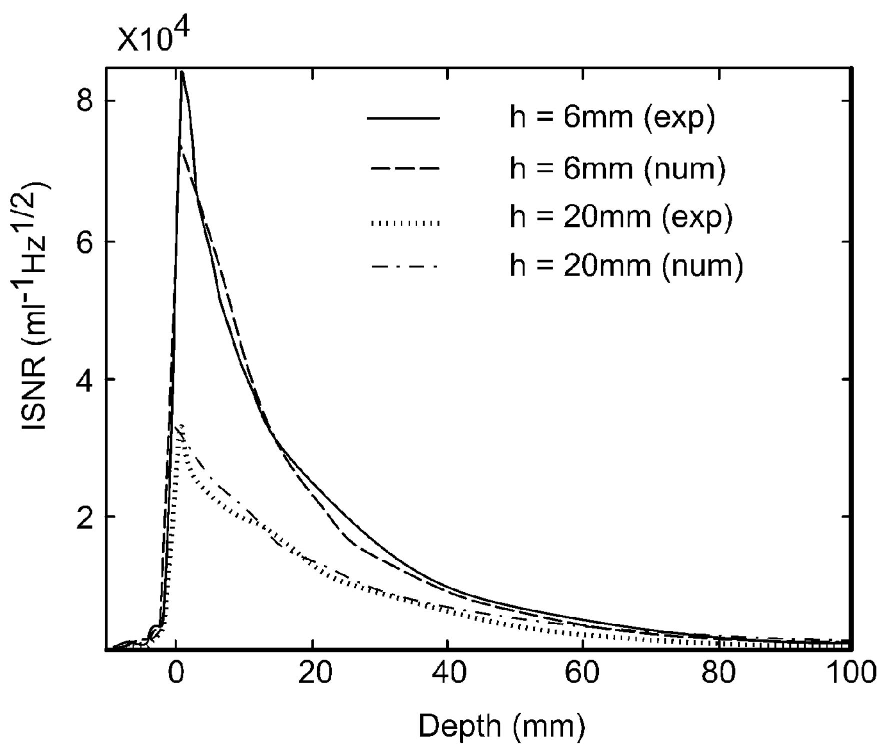
FIG. 7B is a graphical view of experimental and numerically-determined ISNR for two L=200 mm, W=25 mm, and $\in_r=1$ strips fabricated with substrate thicknesses, h=6 mm and 20 mm. The numerical curves are normalized to the (single) peak value of the experimental curve. SNR declines as air-gap, h, increases.

Experimental data from L=200 mm strips prepared with air gaps of h=6 and 20 mm, and widths of W=6, 12, and 25 mm are presented in FIG. 7A,B. These data are essentially consistent with the numerical findings of FIG. 6. FIG. 7A, with fixed h=6 mm, shows some advantage for wider strips at shallow depths of 20-60 mm. Wider strips offer the added benefit of a wider field-of-view in the transverse (xy) plane for 1<W/h<4. That the ISNR declines for larger air gaps is confirmed experimentally by data from two strips with h=6 mm and h=20 mm presented in FIG. 7B. The ISNR of the h=20 mm strip decreases to 30-50% at depths d<50 mm due to the 3.3 fold increase in substrate thickness. The experimental data derive from W=25 mm, L=200 mm strips whose measured unloaded Q values decrease from 183 to 120 as the substrate thickness is increased.

ISNR Dependence on L

Figure 8A:
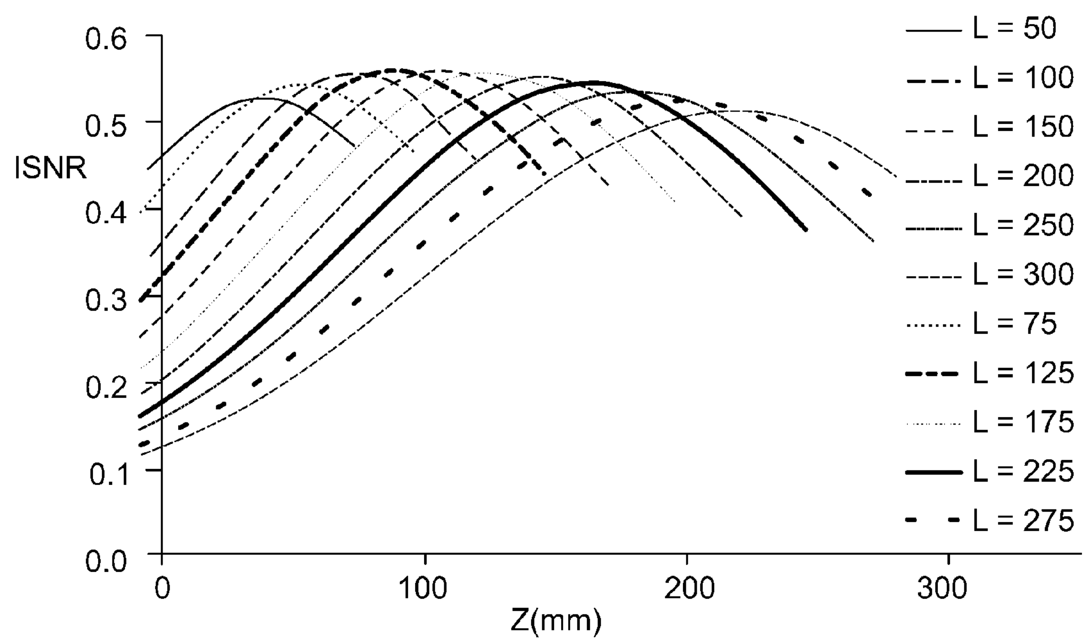
FIG. 8A is a graphical view of n ISNR (same units as in FIG. 2) profile along the z axis at 100 mm depth for a range of strips of length 50 mm≦L≦300 mm (legend at right) oriented along the z-axis, all with air dielectric, acrylic support sheet, W/h~1, and h=6 mm. Peak SNR for each strip occurs at about z≈0.75 L along the non-uniform profiles, but peak SNR is a relatively slow function of L.

FIG. 8A shows the variation of the computed ISNR along the z-axis for strips of various lengths from 50-300 mm designed with the parameters that yield the best practical performance as determined above: air dielectric (with acrylic support sheet), W/h~1, and h=6 mm. The intrinsically non-uniform, almost sinusoidal, ISNR profile along the λ/4 strip length noted for FIG. 4 is apparent for all strip lengths, with maximum values achieved at z≈0.7 L. Note that, although longer strips exhibit broader regions of high ISNR than shorter strips along their axes, the uniformity of the shorter strips along their full length is better, FIG. 8A also demonstrates that the ISNR at a given depth d, is a slow function of L, varying by only 2% over the range d≦L≦3d/2 at d=100 mm in this example. To obtain an empirical expression for the strip length that yields the optimum ISNR at a given sample depth d analogous to Eq. 1 for loops, the analysis of FIG. 8A was repeated for many strip lengths 50 mm≦L≦300 mm and depths 50 mm≦d≦200 mm.

Figure 8B:
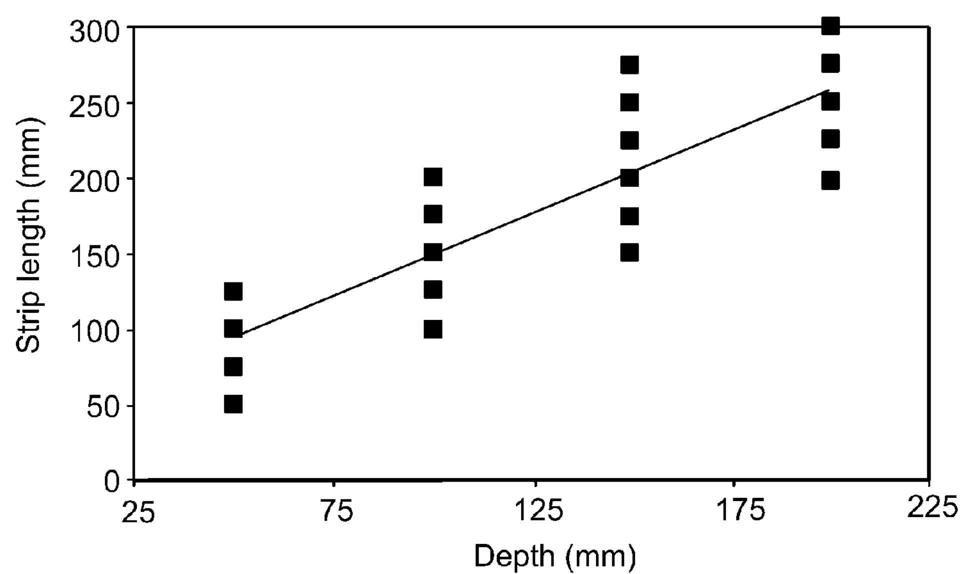
FIG. 8B is a graphical view of a scatter plot of those strip lengths that produce an SNR that lies within 2% of the maximum ISNR for a given depth (horizontal axis) in the range 50≦mm d≦200 mm. The strips use air dielectrics with acrylic support, W/h~1, and h=6 mm. The gradient of the curve of best fit gives the relation between the optimum strip length for a given depth, L=1.3(±0.2)d for these detectors.

FIG. 8B is a scatter plot of those strip lengths that yield ISNR values which are within 2% of the maximum ISNR determined at each of the depths plotted on the horizontal axis. The slope of the line of best fit yields the expression L=1.3 (±0.2) d for the strip length that yields the optimal ISNR at an imaging depth d for the range investigated.

ISNR of Experimental Strip and Loop Detectors

There is provided in FIG. 12 a tabulation that lists the experimental ISNR (upper figures) and raw pixel SNR (lower figures) measurements at the set of depths comprised of the optimal depths for each of the strips and loops investigated. The ISNR of each detector measured at its putative optimal depth (d≈L/1.3 for a strip detector, d=√5a for a loop coil) are located in the shaded boxes. Note that the ISNR of the 5.5-inch loop coil under-performs many strips, even though the ratio of its unloaded to loaded Q is very high. Except for the 200 mm strip, the pixel SNR's of the strips that we built, generally underperform that of both of the loops to a greater extent than does the ISNR, due to the lower loading factors ($Q_u/Q_L$) for the strips.

Figure 9:
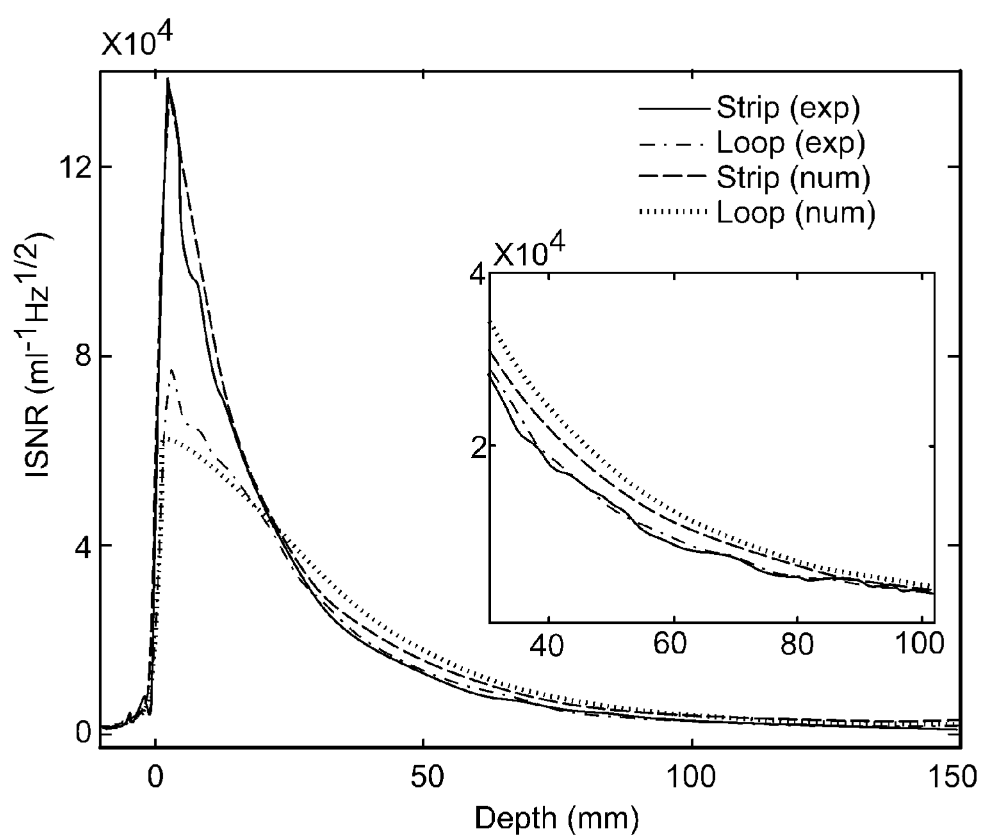
FIG. 9 is a graphical view of absolute numerically-determined (num), and experimentally-measured (exp) ISNR as a function of depth compared for a strip (L=200 mm; W/h=4; E,==1 with acrylic support) at z=0.75 L, and on the axis of a 3 inch (a=38 mm radius) loop coil with 8 distributed tuning capacitors.

FIG. 9 compares the absolute numerical and experimental ISNR performance of the 3-inch (a=38 mm) GE loop surface coil which should perform optimally for d=85 mm based on Eq. (1), and a L=200 mm strip with W/h=4, a h=5 mm air gap, and 3 mm acrylic sheet. The loop has eight equally-spaced tuning capacitors around the circumference which were included in the analysis. The curves show essential agreement between the absolute numerical ISNR calculations and experiment: deviations are generally <10% (see inset). At depths d<20 mm close to the sample, the discrepancy between numerical and experimental curves is greater for the loop (≦15%). Nevertheless, both the numerical and experimental measurements show that the ISNR of the strip is up to double that of the loop. At greater imaging depths, the 3-inch GE loop out-performs the strip, with a maximum of about 20% better performance at the loop's optimal depth (see inset).

The Loop Versus a Two-strip Detector

Figure 10A:
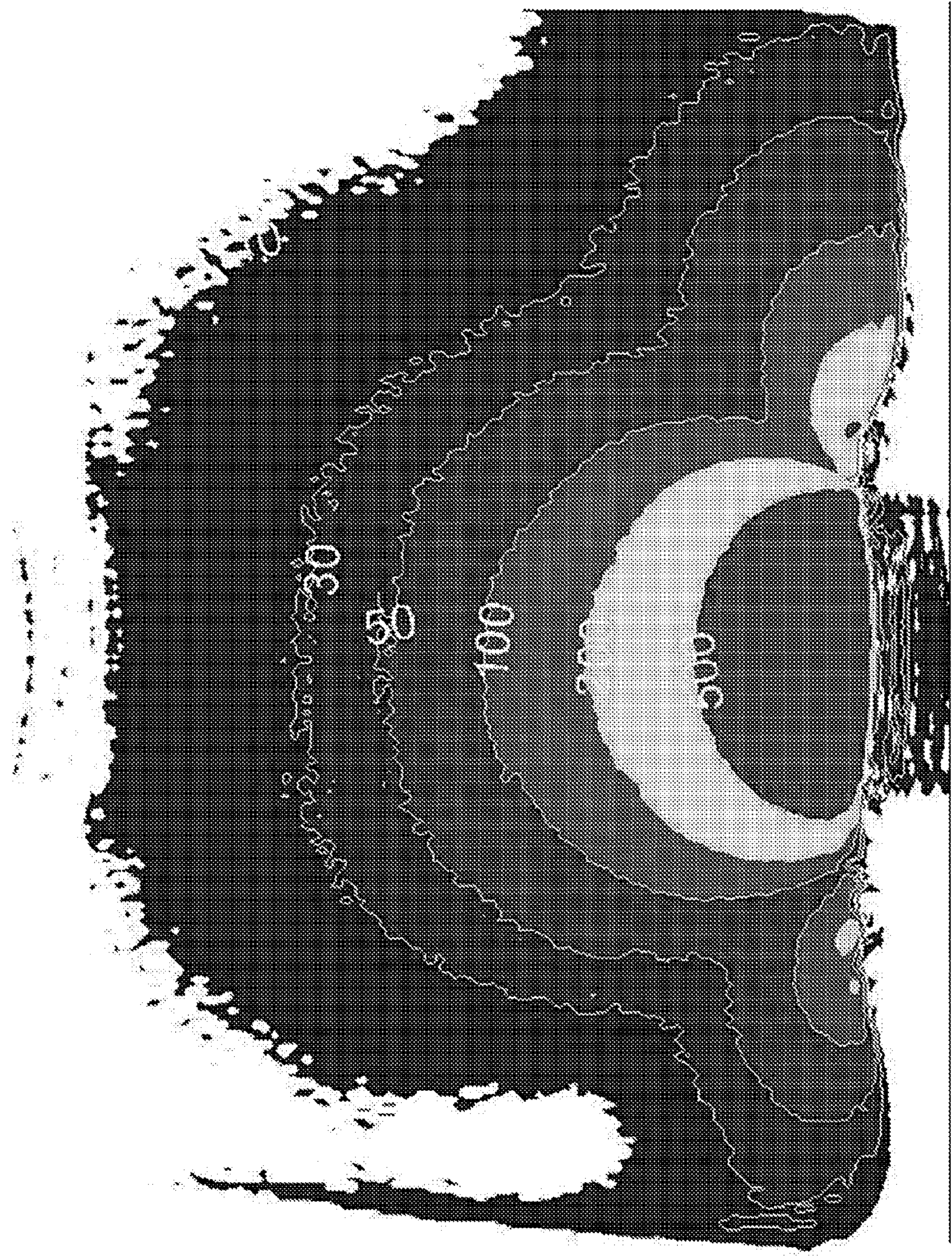
Figure 10B:
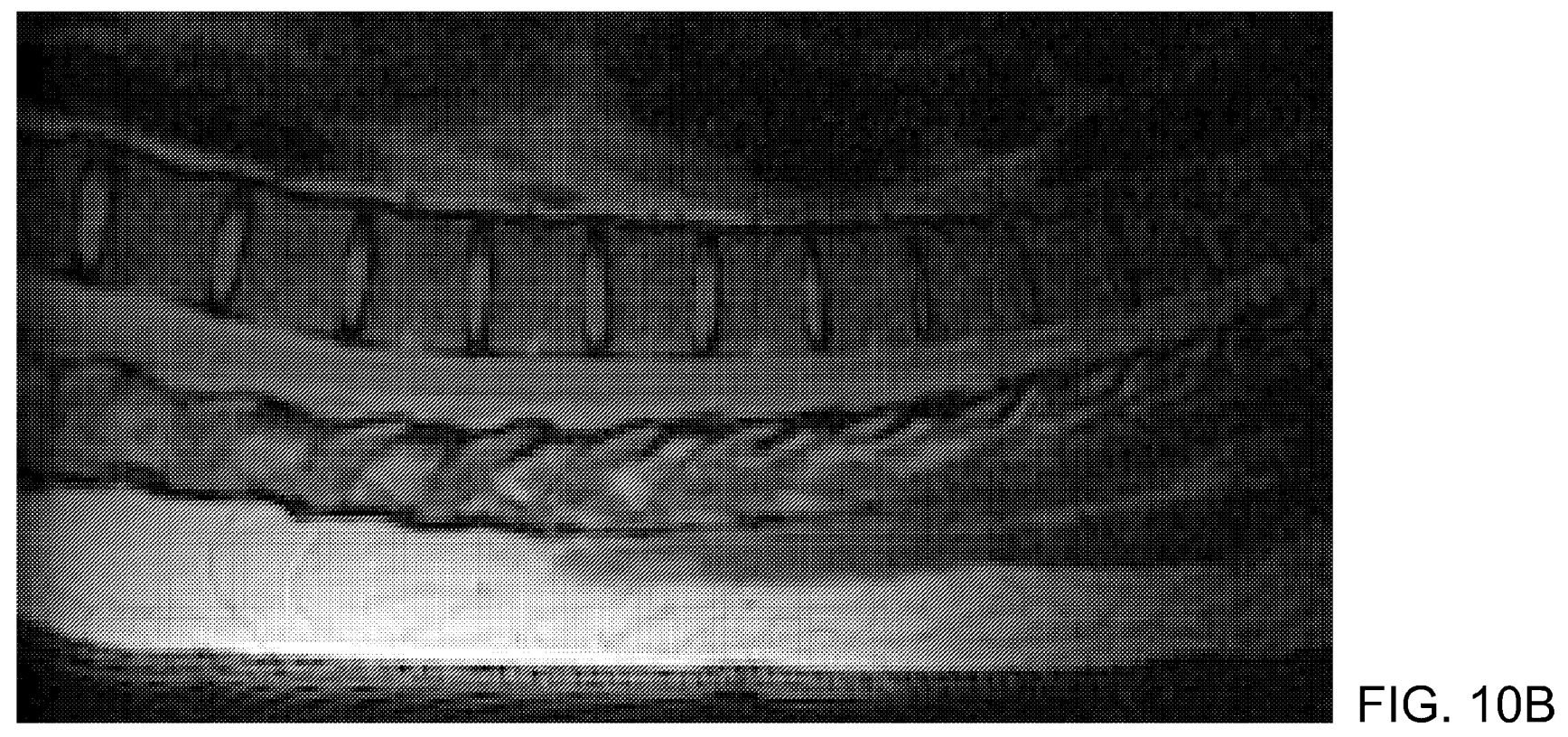

To improve the depth of signal detection for the strip, two strips were combined in parallel with minimum coupling. FIGS. 10A,B compare the experimental sagittal (zy-plane) raw pixel SNR profiles of the 3-inch (a=38 mm) loop detector and a two-strip detector fabricated with L=20 cm, h=6 mm, s=5 cm separation and air dielectric. In FIG. 10B, the image plane bisects the space between the 2 strips wherein the two-strip detector exhibits a ~15% improvement in pixel SNR, compared to that in the equivalent sagittal plane offset 2.5 cm from a single 20 cm strip (annotated in FIG. 10D). The coupling between the 2-strips was measured at −26 dB, which agrees with the numerically computed value of −27 dB. The pixel SNR profiles of the loop and the 2-strip detector in FIGS. 10A and B are comparable: the parallel strips have a more extended SNR profile than the loop, but the maximum pixel SNR is a little higher for the loop.

Figure 10C:
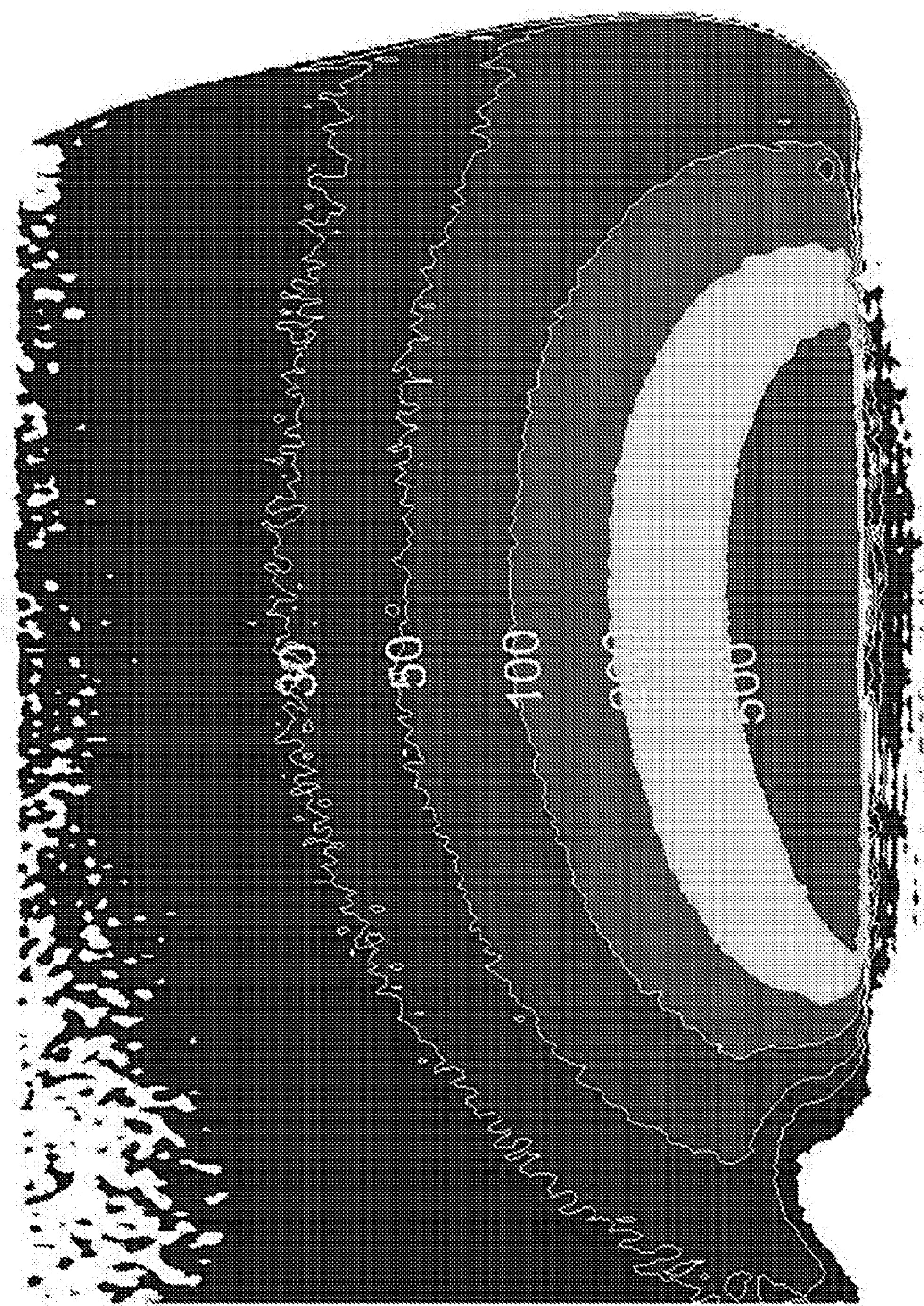
Figure 10D:
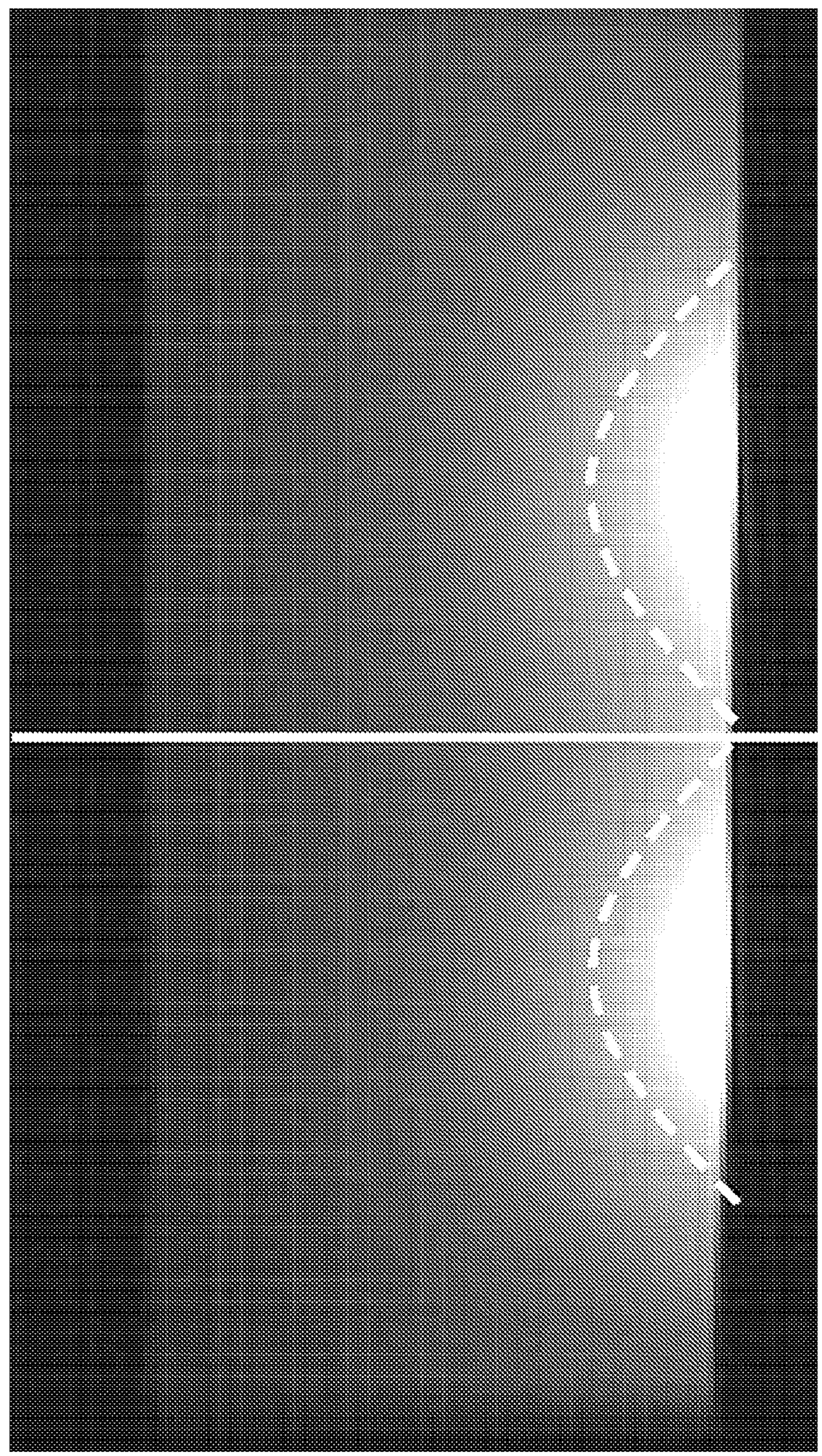

A sagittal image from the spine of a normal volunteer obtained with the 2-strip detector is shown in FIG. 10C. Part (d) shows the sinusoidal-like sensitivity of the 2-strip detector in the transverse (xy) plane. Note that the sensitivity of the 2-strip array is actually higher than the center plane depicted in FIG. 10B, immediately above each strip.

The results of the numerical and experimental analysis are summarized and tabulated in FIG. 13, rules of thumb for designing strip detectors that maximize ISNR.

Discussion of Method and Analysis

The MRI strip detector differs fundamentally from a conventional loop detector with respect to its geometry, field distribution, sensitivity profile, and that a larger portion of its energy, if activated, may be stored as E-field within the dielectric substrate close to the strip, compared to energy stored as B-field close to the loop. Accordingly, the strip detector exhibits spatial sensitivity and ISNR characteristics that are entirely different from loop detectors, so that the usual design rules for optimizing loop detectors are not applicable to strips. Here we have applied brute force numerical analysis using the MoM to derive, for the first time, basic design rules for choosing the length, width, height, substrate dielectric constant, and number of distributed capacitors, to optimize the ISNR performance of the tunable strip detector for a given depth in the sample. To avoid being trapped in local optima, we spot-sampled multiple parameters, as evident in FIGS. 5(*a*) and 6, and included experimental checks (FIG. 12). Although numerical approaches lack the elegance of an analytic solution, it is unclear whether an analytic solution could be found that incorporates all of the variables investigated here. Indeed, the large number of design parameters, as well as the requirement that each strip be numerically tuned, are a significant hurdle even for numerical approaches. The tissue impedance model used was realistic for the body as evidenced by the ability of the analysis to accurately predict strip tuning capacitors and relative performance. Varying the load primarily affects the strip matching conditions, which do not affect the general conclusions at field strengths for which penetration effects are not significant. Although both our computed and experimental results (FIG. 9, FIG. 12) indicate that the ISNR performance of strips and loops are comparable at 1.5 T, ISNR performance for strips may conceivably excel at higher MRI frequencies where probe dimensions become comparable to EM wavelengths, and loop detectors become untunable.

Our numerical evaluations involved computing three different quantities: the values of the tuning elements in the presence of dielectric substrate and sample; the spatial distribution of the transverse RF field; and the noise resistance of the entire loaded structure at resonance. We tested the veracity of the numerical techniques and the Rules of Thumb (FIG. 13) derived therefrom, in four ways. First, we confirmed that the numerical analysis methods correctly yielded the established design rule for the optimum ISNR of a loop coil for a given sample depth, as prescribed by Eq. 1. The results of FIG. 2, validate the calculations as applied to the loop. Second, we showed that numerical tuning of strip detectors yielded the same values within component tolerances for the tuning components that were empirically found necessary to tune seven different sample-loaded experimental strip detectors (see tabulation in FIG. 11). Third, we directly tested the Rules of Thumb with experimental SNR measurements on strip detectors fabricated with four different lengths, two different dielectric substrates, two different heights and three different strip widths. That analysis and experiment are in essential agreement, is substantiated by the data tabulated in FIG. 12 and by FIGS. 5 through 9.

The reduction in ISNR performance that results when substrate thickness h is increased from 6-20 mm, for example, was evident in both the analysis and experimental data shown in FIG. 7. This behavior is consistent with the prior findings that Q and radiation efficiency of the strip detector is higher with moderately thinner substrates. Fourth, we demonstrated agreement between the numerical and experimental relative SNR performance of both the strip and loop detectors, compared one against the other (see FIGS. 9 and 10).

In principle, the experimental ISNR should measure the best SNR achievable from a given detector geometry, assuming that its losses can be made negligible compared to the sample losses. Determination of the detector's loaded and unloaded Q factors, such as provided in the tabulation provided in FIG. 12, are central to the calculation of ISNR from experimental MRI data. Large changes in Q with loading are generally, but not always (caveat), indicative of optimum detector performance, even though they always result in a calculated ISNR that is not much higher than the measured pixel SNR. Conversely a small decrease in Q with loading always results in a calculated ISNR that is much higher than the actual (pixel) SNR. The importance of the caveat is evident in the tabulation in FIG. 12. The ISNR of the 5.5" loop coil at its optimum depth of 155 mm calculated from Eq. 1, is in practice lower than that of the 3" loop at the same 155 mm depth, contradicting Eq. 1 which says that the 5.5" loop should be the best. This result is despite the fact that the large change in Q for the 5.5" coil (from 260 to 20) might otherwise suggest that it is a near-optimum performer. Clearly, it is not. The 5.5" coil evidently has additional losses when loaded (likely E-field losses) for which the experimental ISNR calculation does not properly correct. The same implication might be drawn for the L=15 cm, h=1 cm, $\in_r^{substrate}=1$ strip. Moreover, the higher loaded Q's, and consequent smaller change in Q with loading, generally resulted in greater increases in the ISNR over the actual raw (pixel) SNR for strips, compared with the loop coils. The changes in unloaded Q seen in experimental detectors used to test both the $\in_r^{substrate}$ and h dependence in FIGS. 5(*b*) and 7(*b*) were consistent with the numerical findings for ISNR performance, and this suggests that the effects of detector design parameters on Q are well-accounted for by the numerical approach used here.

The analysis and experiments described herein show that an optimized strip detector can have comparable ISNR performance to an optimized loop detector. The optimum strip has better ISNR than the optimized loop coil close to the detector, but lower ISNR at greater depths (see FIG. 9). It has a more extended sensitive volume of high ISNR in the plane of the strip, but a smaller sensitive volume perpendicular to it. These differences reflect the different characteristic transverse field distributions of the strip and loop.

Putting together two optimized strips spaced by less than the diameter of the optimum loop, substantially improves SNR performance, while maintaining an acceptable level of decoupling between the elements, an advantage of strip arrays underscored in previous work. The added virtue that perpendicular to the strips, the sensitivity profile is almost sinusoidal in nature (see FIG. 10D), renders the combination of strips to form an array, ideal for the extraction of spatial harmonics in parallel MRI.

The inclusion of lumped capacitors in the strip enables tuning over a range of strip lengths, largely eliminating the constraint to length imposed by MRI frequency and dielectric substrate, and thereby permitting the geometry to be optimized for SNR performance. Because increasing strip length and $\in_r^{substrate}$ reduces the tuning capacitance, choosing the lowest possible value for $\in_r^{substrate}$ provides the maximum range of strip lengths that can be tuned for a given MRI frequency. This minimum, $\in_r^{substrate}=1$ also yields the maximum ISNR in our analysis. Note also that fields propagate in strip lines in quasi-transverse EM modes, and that optimizing the transverse magnetic field, $B_r$, of the strip via the geometric parameters (W, h, L, $\in_r^{substrate}$), is tantamount to optimizing the transverse magnetic (TM) mode of operation.

The numerical MoM analysis method described herein can be used to reliably establish the tuning properties of experimental MRI detector coils, and to predict the ISNR performance over their tunable ranges for specific component values and geometric parameters. Iterative application of such analysis can be used to establish those parameters that yield optimum or near-optimum ISNR. Thus, it transpires that an optimized strip detector for 1.5 T has $\in_r \approx 1 \approx W/h$, a dielectric overlay, and a length about 1.3 times the depth being imaged. The ISNR performance of an optimized strip detector is generally comparable to, but has a characteristically different spatial distribution from, a loop detector optimized for the same depth. The superior performance close to the strip suggests high-resolution MRI applications to the skin, the spine and the cerebral cortex, while multiple strips can be assembled with minimal coupling for parallel imaging.

Referring now to FIG. 14 there is shown a Quadrature MRI detector including a MRI strip antenna 400 as described hereinabove and a loop surface coil 500. When the loop and strip antennas 500,400 are assembled in one desired configuration, the resultant shape is in the form of the Greek symbol "phi"-(hereinafter "Φ" coil 300 or "phi" coil 300). When the strip antenna 400 is oriented so the conductor thereof 440 is substantially parallel to $B_0$ (main magnetic field), its principle RF field component is perpendicular to the long axis of the loop antenna 500, whereas the principal component of the loop coil is substantially parallel to the coil's cylindrical axis. Thus, it will be understood that the principal field components of the 2 detectors are mutually orthogonal, and may therefore be used as a quadrature detector. In practice, such a quadrature detector can be implemented and connected to the receiver of an MRI system, for example, by connecting each detector separately to 2 channels of a multi-channel receiver, such as is conventionally used for phased-array MRI detectors. Alternatively connected to a single quadrature receiver channel by means of a quadrature hybrid or the like, such as is conventionally used for connecting quadrature MRI head detector coils and the like.

In further embodiments of the Quadrature MRI "phi" detector, the geometries of the strip antenna 400 and loop antenna 500 are SNR-optimized for the same depth based on the optimum design rules for loop and strip antennas such as that described above and in FIG. 13 for the strip array antenna, and applying Eq 1 for the loop antenna. Thus, for example, for a given depth d of interest, an SNR-optimized "phi" detector may be a strip of length approximately 1.3d, and the loop would have radius of $d/\sqrt{5}$. This shall not, however, be construed as a limitation as the strip and loop antennas can be configured and arranged using any of a number of techniques or alternative design attributes.

This hybrid quadrature MRI detector or phi-coil 300 was numerically analyzed and the results of the analysis was confirmed experimentally. The exemplary embodiment used in such analysis and experimentation included a strip antenna 400 including a single conductor 440 that was 200 mm long and 25 mm wide copper strip (3M Corporation, MN, USA) and which was tuned to a quarter wavelength ($\lambda/4$) at 128 MHz using three lumped capacitors as the reactive tuning components/elements. The strip antenna 400 also has a narrow ground plane 410 (60 mm) to reduce interactions with the loop coil/antenna 500. The ground plane 410 is separated from the conductor 440 by a 6 mm air gap (comprising the dielectric). The conductor also was covered with a 3 mm dielectric overlay. The loop comprising the loop coil/antenna 500 was an r=40 mm circular loop made from 10 mm wide copper strip with three series and one parallel capacitors. Because the strip antenna's sensitivity profile is shifted towards its input end, the circular loop was positioned 20 mm off-center from the conductor 440 as illustrated in FIG. 14.

The SNR performances of the Phi-coil 300 was measured under loaded conditions with a 20 liter cubic phantom of CuSO4-doped 0.35% NaCl solution. Experiments are performed with a Philips Achieva 3 T MRI scanner employing a GRE pulse sequence (TR=800 ms, TE=3.2 ms, NEX=1; flip angle=90°; 10 mm slice thickness). Image (pixel) SNR at a given depth d is derived from the ratio of the signal level to the offset-corrected root-mean-square (rms) background noise in the same image. Because $TE \ll T_2$ and $TR \gg T_1$ for the phantom, the SNR calculation are not corrected for relaxation. To determine the intrinsic SNR (ISNR), the sample-loaded and unloaded coil Q is measured on a Hewlett Packard HP 23605 network analyzer equipped with an impedance test module. Finally, T2-weighted turbo-spin echo (TR=3000 ms; TE=90 ms; NEX=4; 5 mm slice) images of the lumbar spine of a healthy volunteer were acquired with a figure-8 plus loop coil set and with the phi-coil for comparison.

The physical size of each element of the detector pair comprising the phi-coil 300 described above was optimized for a particular depth of 90 mm. The length of the conductor 440 in the phi-coil 300 is 200 mm and its ISNR performance at 90 mm depth is within 2% of the ISNR performance of an optimized conductor for that depth. Thus, the results of the numerical method were validated experimentally.

Although the phi-coil 300 of FIG. 14 is shown using a strip antenna 400 having a single conductor 440 and a single loop antenna 500, this shall not be construed as a limitation. It is within the scope of the present invention for the phi-coil to be arranged as a single quadrature element or arranged so as to provide multiple such in parallel imaging applications either in surface imaging or volume imaging after proper decoupling among element sis achieved. In further illustrative embodiments, the phi-coil 300 can be configured and arranged so as to form an array of such quadrature elements wherein the conductors 440 are arranged so to be parallel to each other in one dimension (i.e., 1D array). In alternative embodiments, the individual elements making up the array have geometries that are optimized for different depths.

In another embodiment, the quadrature elements are arranged so as to form a 2-dimensional (2D) array, where all the conductors are aligned parallel to each other. In this embodiment, it is preferable that elements' positions relative to each other are adjusted such that the coupling between them is minimal (e.g., better than 15 dB isolation).

In an alternate embodiment of the 1D or 2D arrays, the array of quadrature elements is curved such as to comply with a part of the body of interest to MRI examination. In further embodiments, the array is configured so as to be flexible, for example by making the array out of flexible printed circuit board. The curved array is advantageous as it can be used to form a complete cylinder for imaging a human limb, the head, or the torso.

Figure 14B:
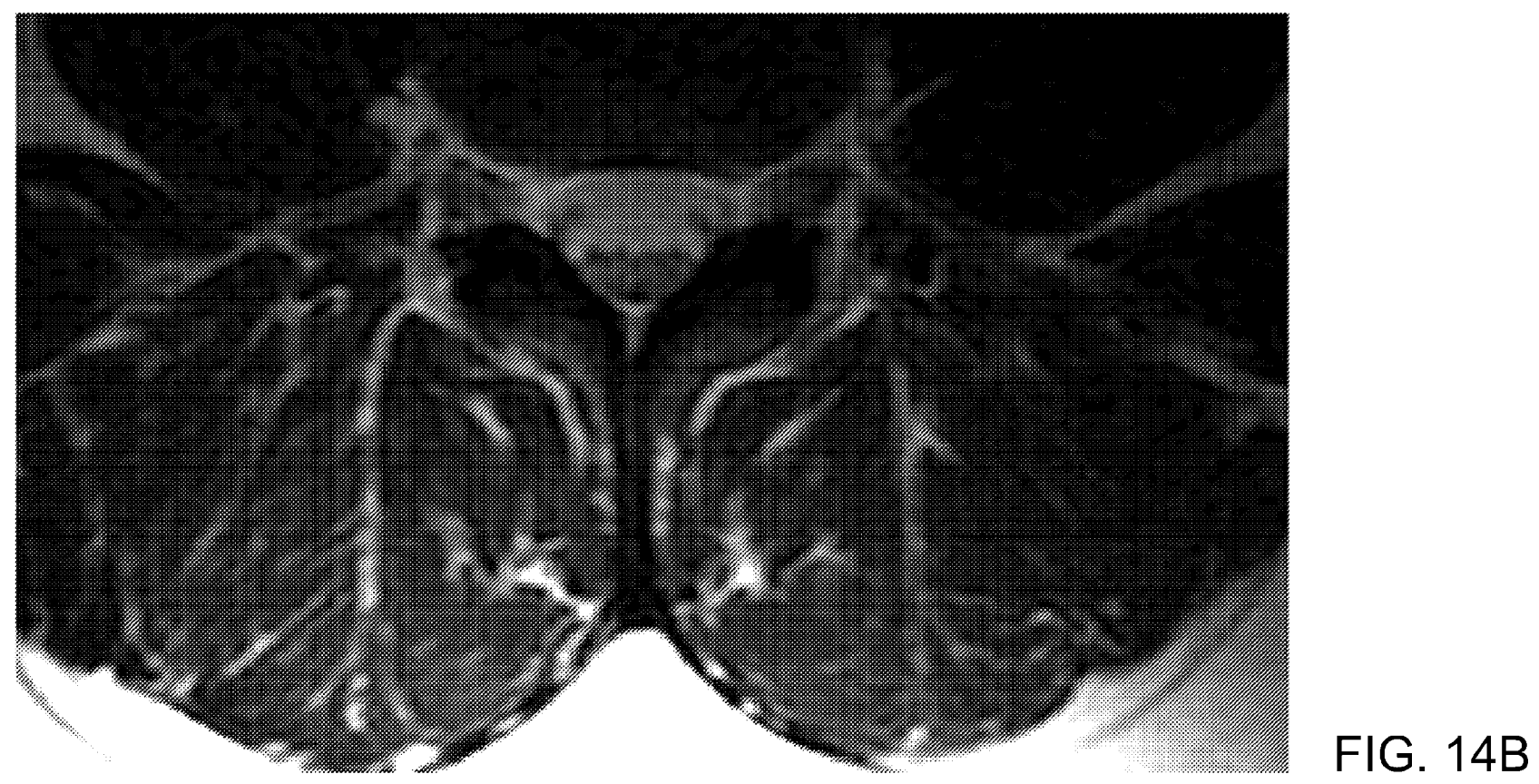
Figure 14C:
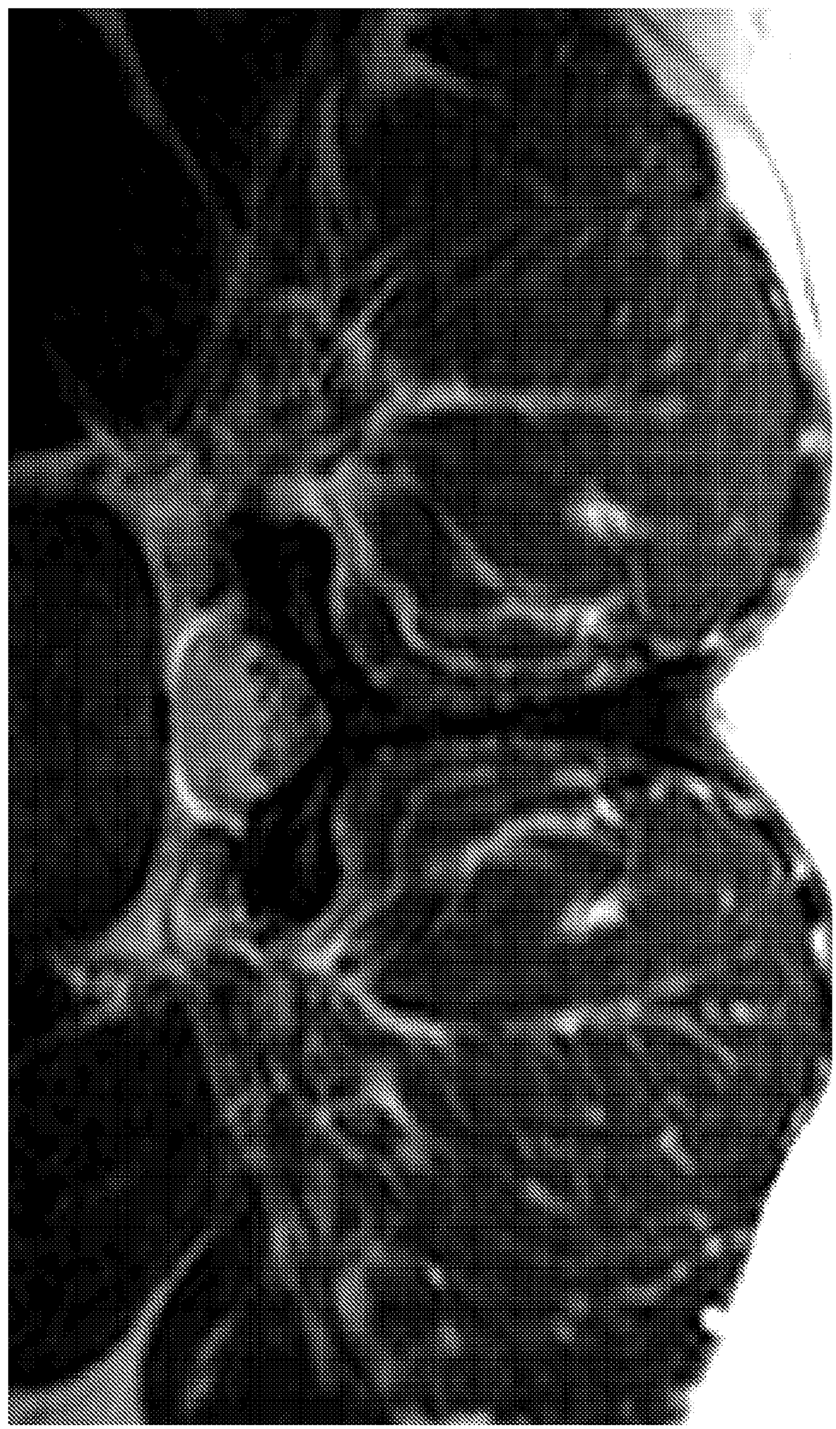

There are shown in FIG. 14B-C, illustrative views of a weighted lumbar spine axial image using the phi-coil of the present invention (FIG. 14B) and for comparison the same anatomical region imaged with a figure '8' plus circular loop (FIG. 14C). More particularly, FIG. 14B is a T2-weighted lumbar spine axial image of a normal volunteer collected with phi-coil 300. Turbo-spin echo sequence with TE=90 ms, TR=2550 ms, FOV=20 cm, matrix size=256×196, slice thickness=5 mm, NEX=4. Signals from each detector element are combined by the root of the sum of squares method. As to FIG. 14C, this is an image of the same anatomical region imaged with figure '8' plus circular loop with identical imaging parameters and signal combination method.

Now referring to FIG. 15, there is shown a schematic view of an exemplary RF excitation and NMR signal detection apparatus 200, or sub-system of an MRI system, for detecting MR signals of excited hydrogen ('H) nuclei, including an RF excitation portion 210 and an MR signal detection portion 220. The RF excitation portion 210 includes transmitter coil(s) 212, a power amplifier 214 and an exciter 216. The transmitter coil(s) 212 are any of a number of transmitter coil designs, arrangement and/or configuration known to those skilled in the art. In an illustrative embodiment, the transmitter coils is a standard, whole-body cylindrical "birdcage" MRI coil that fits within the bore of the MRI system's magnet with cylindrical axis substantially parallel with the long axes of the conductor strips 140 comprising the SA antenna **100*i* and the main field of the magnet. The power amplifier 214 is any of a number of power amplifiers known to those skilled in the MRI arts for amplifying the RF signal being outputted via the transmitter coils 212 to excite the nuclei with the section being scanned of the patient or the object to be scanned, for example a gated 15 kW pulsed RF power amplifier. The exciter 216, as is known to those skilled in the art, is a sub-system that generates the RF waveform that is fed into the power amplifier under computer control. Although depicted as a 4-channel system, it will be understood that the detection apparatus can be extended to much larger arrays-32, 64, 128, 256 and the like by addition of detectors 140 and receiver channels 230**. Similarly, in the case of the "phi coil" each loop coil associated with a strip is also individually and separately connected to a receiver channel.

The MR signal detection portion 220 includes a strip array antenna **100*i* according to the present invention, a plurality of terminations 222 one for each conductor strip 140, a plurality of transmit/receive switches 224 one for each conductor strip, a plurality of preamplifiers 226 and a scanner 228 including a plurality of receivers 230**. Although the strip array antenna

100*i* illustrates yet another embodiment in which five reactive components 150 are electrically coupled to and between each conductor 140 and the ground plane 110, this shall not be construed as a limitation. Any strip array antenna according to the teachings of the present invention including any of the other above-described embodiments, including the strip array and/or the "phi" coil array on flat, flexible, or curved substrates and including those with cylindrical geometries, can be used with the MR signal detection portion 220. Reference also should be made to the foregoing discussions regarding FIGS. 1-14 for components or any details or information not otherwise provided hereinafter.

The transmit/receive (T/R) switches 224 are any of a number of devices known to those skilled in the art that selectively couple and de-couple each conductor strip 140 from the corresponding preamplifier 226. Such de-coupling and coupling is responsive to a signal 201 provided to each of the T/R switches 224. In MRI applications, de-coupling is typically done during the time period when the RF excitation portion 210 is to output the RF excitation signals and such coupling is effected when RF excitation signals are not being generated, more particularly during the time period when MR signals are to be detected. In an illustrative embodiment, the T/R switch 224 is in the form of a diode that is configured and arranged so that it receives a forward bias such that the diode becomes a short circuit when transmitting or outputting the RF excitation signals. In a more particular embodiment, the diodes are physically located on the strip array antenna 100*i* and are connected each one across the proximal reactive tuning element 150 for each conducting strip 140. In yet other embodiments more than one such diode is implemented on each strip in order to affect adequate decoupling. When the diode(s) is(are) activated in this embodiment, the reactive tuning element 150 is shorted, detuning the conductor strip 140 such that it no longer satisfies the $n\lambda/4$ criterion.

The preamplifiers 226 are any of a number of low noise devices or preamplifiers known to those skilled in the art, that amplify the MR signal detected on each of the conductor strips 140 to a level such that the scanner receiver can receive and process the inputted signal(s). In the illustrative embodiments demonstrated experimentally herein, the preamplifiers 224 are 1.5 Tesla or 3 Tesla preamplifiers as manufactured by General Electric Corporation and by Philps Medical Systems, respectively, with noise figures of 0.2-0.8 dB at 63.88 MHz and each with the same gain of about 20-40 dB.

The scanner receivers 230 are any of a number of devices known to those skilled in the art that can receive an RF signal at the desired frequency. Such a scanner receiver 230 also includes the capability of down-converting the received RF signal into a lower frequency quadrature (I and Q) signal. In a more particular embodiment, the scanner receiver 230 further includes an analog to digital (A/D) converter as is known in the art that converts the quadrature analog lower frequency signal into a digital signal that is sent to memory. In an illustrative embodiment, the scanner receiver is any one of a number of such receivers manufactured by General Electric Corporation, Siemens Medical Systems or Philips Medical Systems and/or other MRY systems as are known in the field, now or hereafter.

The terminal end of each conductor strip 140, which comprises a single detector, an array of detectors, or in a "phi" coil, is electrically interconnected to circuitry comprising the termination 222, which includes the termination above for each conductor strip 140. The details as to the termination of each conductor strip (e.g., open circuit and/or a short circuit) are described in U.S. Pat. No. 6,771,070 and U.S. Pat. No. 7,088,104e and thus are not repeated here.

The feed point of each conductor strip 140, which comprises a single detector, an array of detectors, or in a "phi" coil, is electrically connected to a corresponding one of the preamplifiers such that the MR signal (s) detected by the conductor strip is communicated or transmitted to the preamplifier and thence onto the corresponding one of the receivers 230. The electrical interconnection between the conductor strip 140 and the corresponding preamplifier 226 can further included circuitry 232 to couple the detected MR signal out of the conductor strip and to the receiver 230 with minimum losses.

Because of the open or short circuit termination of the conductor strip 140, the direct coupling of the detected MR signal from the conductor strip to a corresponding preamplifier 224 may be inefficient. Thus, circuitry 232 may be provided in the electrical interconnection from the feed point of the conductor strip 140 to improve efficiency and therefore performance, and includes for example circuitry in the form of a reactive device that is configured or arranged to couple the signal to the preamplifier 226. More specifically, the circuitry 232 for coupling out the detected MR signal comprises one of series capacitor or a shunt inductor for respectively one of a short or open termination of the conductor strips.

Also, because the input impedance at the feeding point is either close to zero (for an open termination) or very large (for a short termination), it is desirable to further match the network. Such matching can be accomplished using any of a number of techniques known to those skilled in the art, while taking the following considerations into account. Firstly, the matching network should be configured and arranged such that the output reflection coefficient of the receiver channel at the feeding point is not in the region of ½ in the case of a short termination or −½ in the case of an open termination. In the case where the impedance at the feeding point is close to zero, the matching network should be configured or arranged such that the output reflection coefficient of the receiver channel is made close to zero. In this way, suppression of the standing wave is avoided. While termination 222 and coupling circuitry 232 are illustrated or depicted as separate from the strip antenna 100*i* in FIG. 15, this is not a limitation. In particular, it is within the scope of the present invention and thus an embodiment thereof to incorporate such termination 222 and/or matching/coupling means 232 directly into or within the structure of strip array antenna 100*i*.

In further aspects of the present invention, there is featured a MRI system for acquiring MR image data using a detection device/apparatus of the present invention as described above. Such an system further include means for excitation such as a transmitter that generates the excitation EM (RF) signals or pulses, an antenna for transmitting these signals into at least the region of the imaged object to be scanned, and a controller that selectively controls signal transmission and signal reception so that each occurs at predetermined times and/or predetermined time intervals.

In addition, it will also be understood that while the preferred optimized strip antenna and "phi" coil designs are described for MRI detection, the same designs with the same geometries (planar, flexible, cylindrical) also provide optimum performance when they are used for MRI transmission. When used for transmission, the T/R switching circuitry 224 is omitted, and instead of connecting each strip to a preamplifier 226, the strips are connected to an RF power source, such as an RF power amplifier module, or an RF power manifold which distributes RF power from a single RF power amplifier to all of the individual separate strips being deployed for MRI excitation., as known to those skilled in the art.

As is known to those skilled in the art, such a system also further includes a main or primary magnet system that generates a homogeneous magnetic field in a predetermined region in which the object or portion thereof is to be imaged, gradient coils for generating one or additional magnetic fields, controllers for controlling the operation and energization of each of the main and gradient coils, the generation/transmission of the excitation EM (RF) signals and the acquisition/detection of MR signals by the detection system. Such a system further includes a processing apparatus that processes the data acquired so as to yield an image of the object that was scanned.

Although a preferred embodiment of the invention has been described using specific terms, such description is for illustrative purposes only, and it is to be understood that changes and variations may be made without departing from the spirit or scope of the following claims.

Incorporation By Reference

All patents, published patent applications and other references disclosed herein are hereby expressly incorporated by reference in their entireties by reference.

EQUIVALENTS

Those skilled in the art will recognize, or be able to ascertain using no more than routine experimentation, many equivalents of the specific embodiments of the invention described herein. Such equivalents are intended to be encompassed by the following claims.

What is claimed is:

1. An MRI detector for detecting MRI signals substantially from a depth of interest in a specimen undergoing MRI, comprising:

at least one conducting member;

a ground conducting member;

a first dielectric portion disposed between the at least one conducting member and the ground member so as to separate and displace the at least one conducting member relative to the ground member;

wherein a length of the at least one conductor is substantially in the approximate range of about 1.3 times said depth of interest; and wherein the at least one conducting member is tuned to resonate at a desired MRI frequency.

2. The MRI detector of claim 1, wherein the first dielectric portion is constituted so as to have a dielectric constant of substantially equal to 1.

3. The MRI detector of claim 2, wherein the detector further includes a second dielectric portion positioned on a side of the conducting member opposite to the first dielectric member, thereby separating the conducting from the sample being studied.

4. The MRI detector of claim 1, wherein the conducting member has a width and the width is adjusted to substantially equal the spacing between the strip and the ground.

5. The MRI detector of claim 1, further comprising N reactive tuning elements, where N is an integer >1 and wherein at least one of the N reactive tuning elements is connected between the conducting member and the ground member so as to tune the conducting member so as to resonate at the desired MRI frequency.

6. The MRI detector of claim 5, wherein the at least one reactive tuning element is such that the conductor member is tuned to resonate at an integer multiple of one fourth of the electromagnetic wavelength when loaded with the sample undergoing MRI.

7. The MRI detector of claim 5, wherein said at least one reactive tuning element is comprised of one or more capacitors that are distributed along the length of the conducting member.

8. The MRI detector of claim 1, wherein the conductor member is tuned to resonate at an integer multiple of one fourth of the electromagnetic wavelength when loaded with the sample undergoing MRI.

9. The MRI detector of claim 1, wherein the at least one conducting member further is comprises a plurality of pairs of conducting strips and ground members to form an MRI phased-array.

10. The MRI detector of claim 9, wherein the pairs of conducting strips and ground conducting members are substantially parallel.

11. The MRI detector of claim 9, wherein the pairs of ground conducting members are interconnected to each other.

12. The MRI detector of claim 9, wherein the pairs of conductors are substantially parallel and wherein each pair is separated from its neighbor by a distance of at least substantially equal to the spacing between a strip and its ground member.

13. The MRI detector of claim 1, wherein the at least one conducting member and the ground member are fabricated of a flexible material to conform to the shape of the sample.

14. The MRI detector of claim 1, further comprising;

a cable; and a decoupling mechanism operably coupled to strip array antenna by the cable, the decoupling mechanism including circuitry to switch off the detector during MRI excitation of the sample by separate MRI excitation means.

15. The detection device of claim 1, wherein device of claim 1, wherein the conducting member includes a length and the length is adjusted to provide optimized SNR performance for one of the heart, the kidneys, the abdomen, the brain, the liver, and the thyroid.

16. The MRI detector of claim 1 wherein the at least one conducting member is a plurality of members and wherein the length of at least one of the conductors is adjusted for a different depth of interest than the others.

17. An MRI system for acquiring image data from a specimen undergoing MRI, said system comprising:

an MRI detector, the MRI detector including:

at least one conducting member;

a ground conducting member;

a first dielectric portion disposed between the at least one conducting member and the ground member so as to separate and displace the at least one conducting member relative to the ground member;

wherein a length of the at least one conductor is substantially in the approximate range of about 1.3 times a depth of interest in the sample undergoing MRI; and wherein the at least one conducting member is tuned to resonate at a desired MRI frequency.

18. An MRI excitation and detection apparatus, comprising:

an excitation mechanism that generates signals for exciting nuclei of a specimen undergoing MRI; and an MRI detector, the MRI detector including:

at least one conducting member;

a ground conducting member;

a first dielectric portion disposed between the at least one conducting member and the ground member so as to separate and displace the at least one conducting member relative to the ground member;

wherein a length of the at least one conductor is substantially in the approximate range of about 1.3 times a depth of interest in the sample undergoing MRI; and wherein the at least one conducting member is tuned to resonate at a desired MRI frequency.

19. The MRI excitation and detection apparatus of claim 18, further comprising a mechanism for preventing acquisition of image data by the MRI detector when said excitation mechanism is generating excitation signals.

20. A method for imaging a specimen using an MRI process; said method comprising the steps of:

providing an MRI detector, the MRI detector including:

at least one conducting member, a ground conducting member, a first dielectric portion disposed between the at least one conducting member and the ground member so as to separate and displace the at least one conducting member relative to the ground member, wherein a length of the at least one conductor is substantially in the approximate range of about 1.3 times a depth of interest in the sample undergoing MRI, and wherein the at least one conducting member is tuned to resonate at a desired MRI frequency; and acquiring image date using the provided detector.

21. An MRI antenna for transmitting MRI signals substantially to a depth of interest in a sample for exciting MRI, comprising:

at least one conducting member;

a ground conducting member;

a first dielectric portion disposed between the at least one conducting member and the ground member so as to separate and displace the at least one conducting member relative to the ground member;

wherein a length of the at least one conductor is substantially in the approximate range of about 1.3 times said depth of interest of a specimen; and wherein the at least one conducting member is tuned to resonate at a desired MRI frequency.

22. The antenna of claim 21 wherein the at least one conducting member is a plurality of members arranged in an array.

23. The antenna of claim 22, wherein the array is arranged cylindrically about an MRI sample of interest.

24. The antenna of claim 22, wherein the length of at least one of the conductors is adjusted for a different depth of interest than the others.

* * * * *